US011276634B2

(12) United States Patent
Pietambaram et al.

(10) Patent No.: US 11,276,634 B2
(45) Date of Patent: Mar. 15, 2022

(54) HIGH DENSITY PACKAGE SUBSTRATE FORMED WITH DIELECTRIC BI-LAYER

(71) Applicant: Intel Corporation, Santa Clara, CA (US)

(72) Inventors: Srinivas V. Pietambaram, Chandler, AZ (US); Rahul N. Manepalli, Chandler, AZ (US); David Unruh, Chandler, AZ (US); Frank Truong, Gilbert, AZ (US); Kyu Oh Lee, Chandler, AZ (US); Junnan Zhao, Gilbert, AZ (US); Sri Chaitra Jyotsna Chavali, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/607,601

(22) PCT Filed: May 23, 2017

(86) PCT No.: PCT/US2017/033897
§ 371 (c)(1),
(2) Date: Oct. 23, 2019

(87) PCT Pub. No.: WO2018/217188
PCT Pub. Date: Nov. 29, 2018

(65) Prior Publication Data
US 2020/0075473 A1  Mar. 5, 2020

(51) Int. Cl.
*H01L 23/498* (2006.01)
*H01L 23/14* (2006.01)
*H01L 21/48* (2006.01)

(52) U.S. Cl.
CPC .... *H01L 23/49838* (2013.01); *H01L 21/4857* (2013.01); *H01L 23/145* (2013.01); *H01L 23/49822* (2013.01)

(58) Field of Classification Search
CPC ............ H01L 23/49838; H01L 23/145; H01L 23/49822; H01L 21/4857
(Continued)

(56) References Cited

U.S. PATENT DOCUMENTS 5,040,047 A * 8/1991 Cole ...................... H01L 24/24
257/642
5,612,254 A  3/1997 Mu et al.
(Continued)

FOREIGN PATENT DOCUMENTS

WO  2018217188 A1  11/2018

OTHER PUBLICATIONS

PCT International Search Report and Written Opinion issued in PCT Application No. PCT/US2017/033897 dated Feb. 23, 2018; 16 pages.

*Primary Examiner* — Tong-Ho Kim
(74) *Attorney, Agent, or Firm* — Patent Capital Group

(57) ABSTRACT

Disclosed herein are integrated circuit (IC) package substrates formed with a dielectric bi-layer, and related devices and methods. In some embodiments, an IC package substrate is fabricated by: forming a raised feature on a conductive layer; forming a dielectric bi-layer on the conductive layer, where the dielectric bi-layer includes a first sub-layer having a first material property and a second sub-layer having a second material property, and where the top surface of the second sub-layer is substantially planar with the top surface of the raised feature; and removing the first sub-layer until the second material property is detected to reveal the conductive feature. In some embodiments, an IC package substrate is fabricated by: forming a dielectric bi-layer on a patterned conductive layer, where the first sub-layer is less
(Continued)

susceptible to removal than the second sub-layer; forming an opening in the dielectric bi-layer; etching; and forming a via having vertical sidewalls.

19 Claims, 13 Drawing Sheets

(58) Field of Classification Search
USPC .......................................................... 257/668
See application file for complete search history.

(56) References Cited

U.S. PATENT DOCUMENTS

| | | | | |
|---|---|---|---|---|
| 5,866,952 | A * | 2/1999 | Wojnarowski | H01L 21/568 |
| | | | | 257/788 |
| 6,117,782 | A | 9/2000 | Lukanc et al. | |
| 6,577,011 | B1 | 6/2003 | Buchwalter et al. | |
| 2002/0160604 | A1 * | 10/2002 | Quek | H01L 21/76835 |
| | | | | 438/689 |
| 2011/0155433 | A1 * | 6/2011 | Funaya | H05K 1/115 |
| | | | | 174/258 |
| 2014/0264830 | A1 * | 9/2014 | Teh | H01L 23/5329 |
| | | | | 257/737 |
| 2015/0122533 | A1 * | 5/2015 | Kao | C09D 5/24 |
| | | | | 174/257 |

* cited by examiner

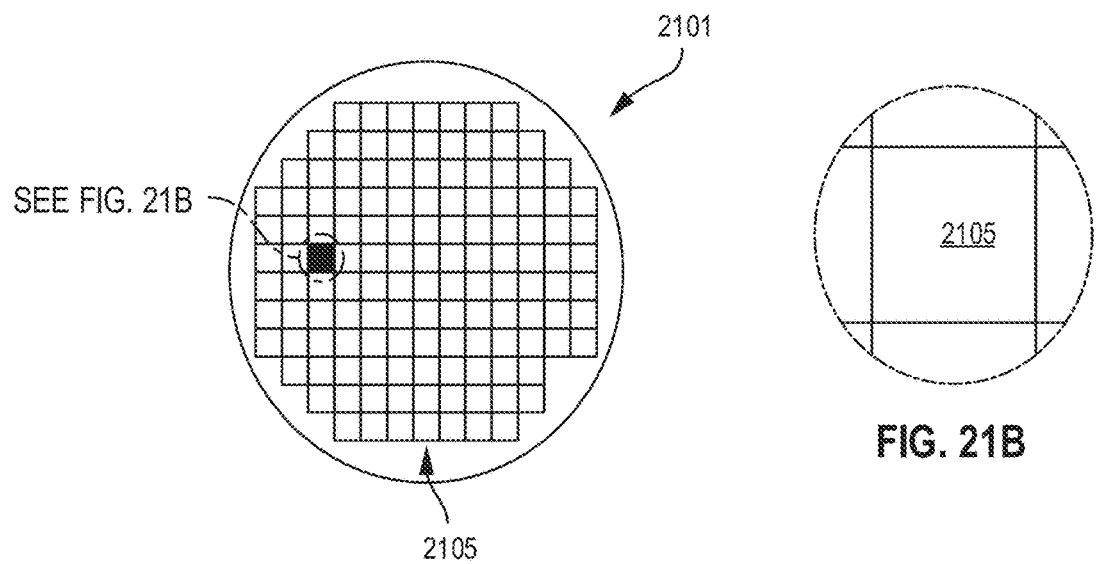
FIG. 21A
FIG. 21B
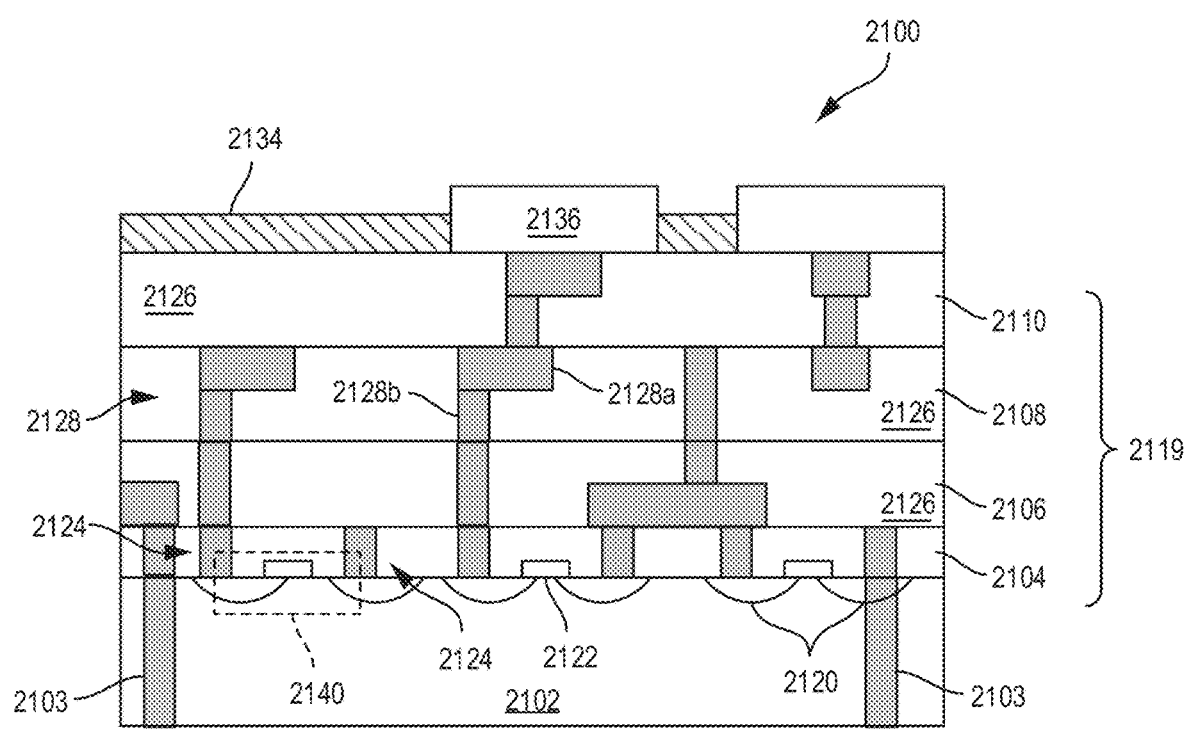
FIG. 21C

HIGH DENSITY PACKAGE SUBSTRATE FORMED WITH DIELECTRIC BI-LAYER

This application is a national stage application under 35 U.S.C. § 371 of PCT International Application Serial No. PCT/US2017/033897, filed May 23, 2017, titled "HIGH DENSITY PACKAGE SUBSTRATE FORMED WITH DIELECTRIC BI-LAYER." The disclosure of this application is considered part of (and is incorporated by reference in) the disclosure of this application.

FIELD

Embodiments relate to manufacturing of semiconductor devices. More particularly, the embodiments relate to manufacturing a package substrate using a bi-layer dielectric for more precise planarization and etching.

BACKGROUND

Semiconductor dies are routinely connected to larger circuit boards such as motherboards and other types of printed circuit boards (PCBs) via a package substrate. A package substrate typically has two sets of connection points, a first set for connection to the die or multiple dies and a second less densely-packed set for connection to the PCB. A package substrate generally consists of an alternating sequence of a plurality of organic insulation or dielectric layers and a plurality of patterned electrically conductive layers forming traces between the insulation layers. Electrically conductive vias, which extend through the insulation layers, electrically interconnect the conductive layers. Continued advancements in integrated circuit technology have resulted in the need for package substrates with greater electrical performance and higher routing densities, which requires more exact techniques in the manufacturing of package substrate layers.

BRIEF DESCRIPTION OF THE DRAWINGS

Embodiments described herein illustrated by way of example and not limitation in the figures of the accompanying drawings, in which like references indicate similar features. The following figures are illustrative, and other processing techniques or stages can be used in accordance with the subject matter described herein. Furthermore, some conventional details have been omitted so as not to obscure from the inventive concepts described herein.

FIGS. 21A and 21B are top views of a wafer and dies that may be used with any of the embodiments of the IC structures disclosed herein.

FIG. 21C is a cross-sectional side view of an IC device that may be used with any of the embodiments of the IC structures disclosed herein.

DETAILED DESCRIPTION

Figure 1:
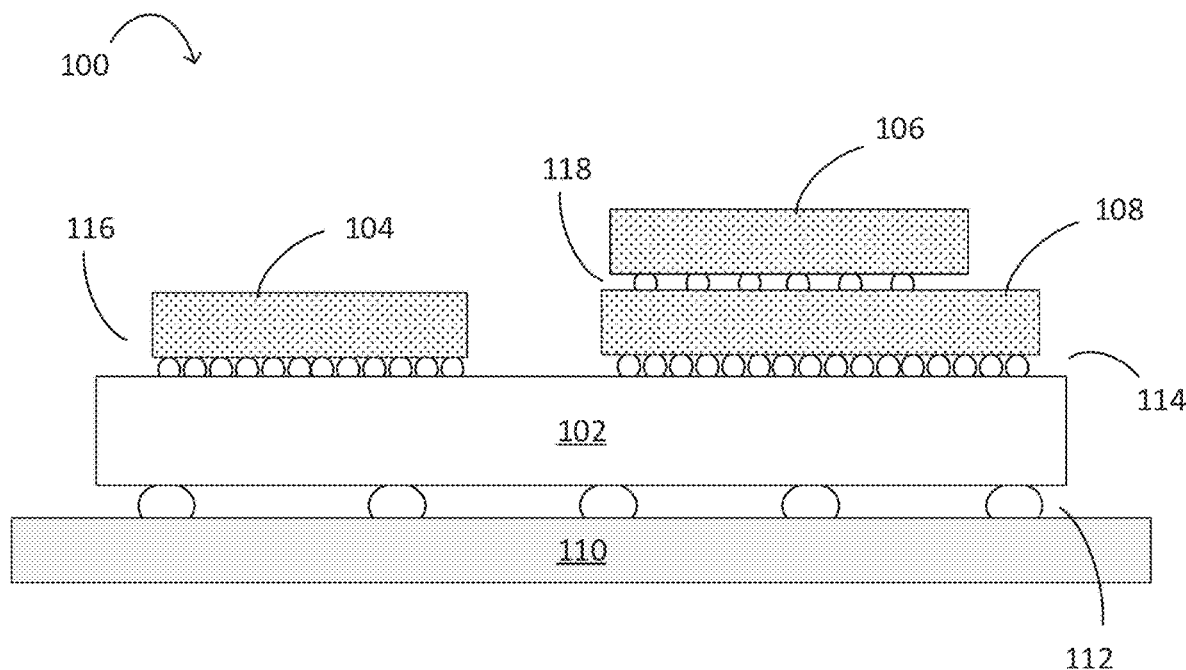
FIG. 1 is a cross-sectional view of an integrated circuit assembly having an integrated circuit package substrate that includes one or more dies, in accordance with various embodiments.

Disclosed herein are integrated circuit (IC) package substrates formed with a dielectric bi-layer having a first sub-layer with a first material property and a second dielectric sub-layer with a second material property, as well as related devices and methods. For example, in some embodiments, an IC package substrate may be fabricated by: forming a raised feature on a conductive layer; forming a dielectric bi-layer on the conductive layer, where the dielectric bi-layer includes a first dielectric sub-layer having a first material property and a second dielectric sub-layer having a second material property, and wherein the top surface of the second dielectric sub-layer is approximately planar with the top surface of the raised feature on the conductive layer; and removing the first dielectric sub-layer until the second material property is detected to reveal or expose the top surface of the raised feature. In some embodiments, where the second dielectric bi-layer is substantially planar with the top surface of the raised feature, only the first dielectric sub-layer covers the top surface of the raised feature and only the first dielectric sub-layer is removed to expose the top surface of the raised feature. In some embodiments, where the second dielectric bi-layer is substantially planar with the top surface of the raised feature, both the first and second dielectric sub-layers cover the top surface of the raised feature, and the first dielectric sub-layer and some of the second dielectric sub-layer are removed to reveal the top surface of the raised feature.

In some embodiments, an IC package substrate may be fabricated by: forming a dielectric bi-layer on a patterned conductive layer, wherein the dielectric bi-layer includes a first dielectric sub-layer and a second dielectric sub-layer, and wherein the first dielectric sub-layer is less susceptible to removal by, for example, etching, as compared to the second dielectric sub-layer; forming an opening in the dielectric bi-layer; etching the opening, wherein the first dielectric sub-layer is etched less than the second dielectric sub-layer; and, optionally, depositing a conductive material into the opening to form a conductive via, wherein the conductive via sidewalls are substantially vertical or parallel rather than angled.

In some embodiments, a dielectric bi-layer is formed by laminating a preformed dielectric bi-layer laminate on the conductive layer. In some embodiments, a dielectric bi-layer is formed by curing a material that separates into a first dielectric sub-layer and a second dielectric sub-layer. In some embodiments, a first dielectric sub-layer may have resin or organic polymer as the primary component (for example, in proportions greater than 50% by weight), In some embodiments, a second dielectric material may have filler as the primary component (for example, in proportions greater than 50% by weight). The filler may be organic or inorganic material.

In some embodiments, a first material property and a second material property have different optical properties for detecting or distinguishing between the two sub-layers during planarization. In some embodiments, a first material property and a second material property have different electrical properties for detecting the interface between the two sub-layers during planarization. In some embodiments, a first material property and a second material property have different mechanical properties for detecting the interface between the two sub-layers during planarization.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," "on," and the like in the description and in the claims, if any, are used for descriptive purposes and not necessarily for describing permanent relative positions.

Package substrates for multi-chip packaging (MCP) require significantly high density input/output (IO) routing. As described herein, very high density interconnects or routing may be a single layer or multiple layers where the conductive traces in multiple layers are connected by vias. As used herein, "very high density" (VHD) routing refers to an input and output (IO) density associated with a substrate layer, where the IO density is defined as IO per millimeters per layer (IO/mm/Layer). Further, as used herein, a VHD routing refers to an IO density that is greater than 100 IO density (i.e., 100 IO/mm/layer). The IO density of a substrate may be physically constrained by other elements within the substrate, including via size, line/space pitch (L/S), bump pitch, via-to-pad alignment, pad-to-via alignment, and material (e.g. resist and thin dielectric material) properties. For example, using a known process to achieve a 110 um bump pitch results in a density of less than 20 IO/mm/layer where vias have a diameter of 49 um, a 9/12 um L/S, and 14 um alignment. As used herein, bump pitch refers to the distance between bumps (i.e., bump-to-bump distance from center point to center point). As used herein, "line space", "line space pitch", and "L/S" are used interchangeably and refer to the distance in microns between a die, typically a silicon die, with plates and the substrate connections and is measured by the width of the conductive trace plus the space between the conductive trace and the next conductive trace. High-density interconnect layers may enable communication between dies on the same integrated circuit package by conductively connecting or coupling the dies. Very high density routing requires precision in patterning, alignment and via formation capabilities to create thinner layers and narrower traces.

The term "interconnect" (also sometimes referred to as a trench, a line, or a trace) may be used to describe an electrically conductive line isolated by a layer typically comprising an interlayer dielectric material that is provided within the plane of an IC chip. Such interconnects are typically stacked into several levels with a layer of dielectric in between the metal layers to form a package substrate, an interposer, or other integrated circuit interconnect structures of an IC chip. This stack of dielectric and conductive layers may be referred to herein as the "package substrate", "build up layer", or "package substrate build up layer", and may be formed using build up processes that are known in the art. As is also known in the art, the term "via" is used to describe an electrically conductive element that electrically interconnects two or more metal trenches of different levels. Vias are provided substantially perpendicularly to the plane of an IC chip. A via may interconnect two metal trenches in adjacent levels or two metal trenches in levels that are not adjacent to one another. As is known in the art, the terms lines, trenches, and vias are commonly associated with the features that are used to form metal interconnects. As used herein, the terms "line", "trace", "interconnect", and "trench" may be used interchangeably.

To form electrical interconnects, dielectric layers may be patterned to create one or more trench or via openings that may be filled with metal to form interconnects, in general, a feature used to form a metal interconnect is a depression having any shape formed in a substrate or layer deposited on the substrate. The feature is filled with conducting material. The trenches or vias may be created using conventional wet or dry etch semiconductor processing techniques. Dielectric materials may be used to isolate electrically conducting metal interconnects from the surrounding components.

FIG. 1 is a cross-sectional view of an integrated circuit assembly 100 having an integrated circuit package substrate 102 that includes one or more dies 104, 106, 108, in accordance with various embodiments. Multiple dies 104, 108 may be coupled to a package substrate 102 via first-level interconnects (FLI) 114, 116. Dies 106, 108 may be stacked and electrically coupled to the package substrate 102 via another die. The package substrate 102 may include electrical pathways (not shown) to route signals or power between the FLI 114, 116 and the second-level interconnects (SLI) 112. These electrical or conductive pathways may be high density or very high density interconnects as described herein. In some embodiments, the area 114, 116 between the die 104, 108 and the package substrate 102, and the area 118 between die 108 and die 106 may be filled with underfill (not shown). The package substrate 102 may be coupled to a circuit board 110 via SLI 112.

Figure 2:
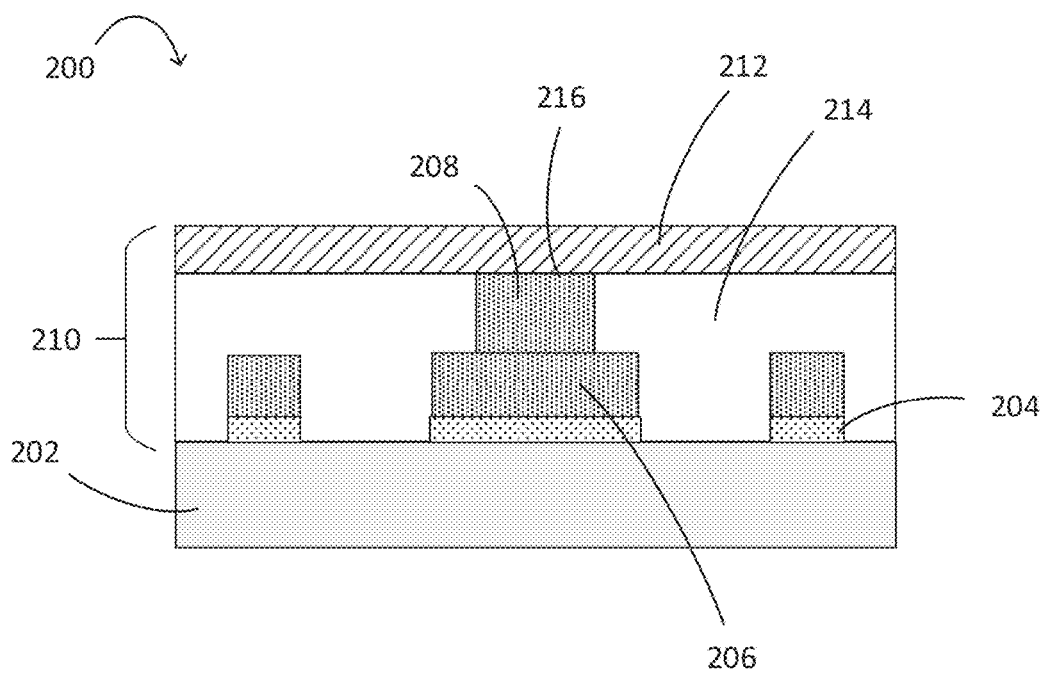
FIG. 2 is a cross-sectional view of a package substrate during the manufacturing stage of laminating a dielectric bi-layer on a raised feature on a conductive layer, in accordance with various embodiments.

FIG. 2 is a cross-sectional view of an example package substrate during the manufacturing stage of laminating a dielectric bi-layer on a raised feature on a conductive layer, in accordance with various embodiments. FIG. 2 illustrates assembly 200 having a dielectric layer 202, one or more patterned conductive layers having conductive features 204, 206, 208 and a dielectric bi-layer 210 deposited on conductive features 204, 206, 208. Dielectric bi-layer 210 may include a first sub-layer 212 and a second sub-layer 214. In some embodiments, as shown in FIG. 2, the second sub-layer 214 may be formed having a top surface that is substantially planar 216 with the top surface of the raised conductive feature, which is conductive via 208. The top surface may be exposed by planarizing the first sub-layer until the second sub-layer is detected.

The first sub-layer 212 may have a first material property and the second sub-layer 214 may have a second material property that is different from the first material property. The first and second material properties may be detectable by a sensor, such as an optical sensor or an electrical sensor. The detectable material property may indicate the presence of the first sub-layer, the presence of the second sub-layer, and the interface between the first and second sub-layers. In some embodiments, a sub-layer may include one or more fillers to change the properties of the layer. In some embodiments, a sub-layer material may have inherent properties that may be different from the other sub-layer and may be detected by a sensor.

Dielectric bi-layer 210 may be formed using any suitable process, such as lamination or slit coating and curing. In some embodiments, the dielectric bi-layer may be a pre-formed laminate. In some embodiments, the dielectric bi-layer may be a slurry or varnish, which is a solid filler material suspended inside of a viscous semi-solid that phase separates into two layers (i.e., the first and second sub-layers). The dielectric bi-layer may be made with any suitable material having the desired properties. In some embodiments, the dielectric bi-layer may include various epoxies, resins, and filler material, such as, glass or silica, among other organic or inorganic fillers. In some embodiments, the first dielectric sub-layer material may be mainly an organic polymer or a polymer-based resin by weight (commonly referred to as "resin-rich" layer). In some embodiments, the second dielectric sub-layer material may be about 20% to 90% organic, inorganic, or synthetic filler by weight (commonly referred to as "filler-rich" layer). In some embodiments, the second dielectric sub-layer material may be about 40% to 70% filler by weight. For example, the first dielectric sub-layer material may be a resin-rich material, such as epoxy resin, epoxy molding compound (EMC), or polyimide, where the density proportion of non-filler material in the dielectric composite is greater than 50% by weight, and the second sub-layer material may be a filler-rich material, including silica, alumina, barium titanate, or other synthetic organic fillers, where the density proportion of filler in the dielectric composite is greater than 50% by weight. In some embodiments, the dielectric sub-layer materials may be selected so that one sub-layer is removed more readily (i.e., is more susceptible to etching or planarization) as compared to the other sub-layer. For example, in some embodiments, the resin-rich layer may be less susceptible to removal as compared to the filler-rich layer.

FIGS. 3-14 are cross-sectional side views of various stages in the manufacture of an example package substrate utilizing a dielectric bi-layer, in accordance with various embodiments.

Figure 3:
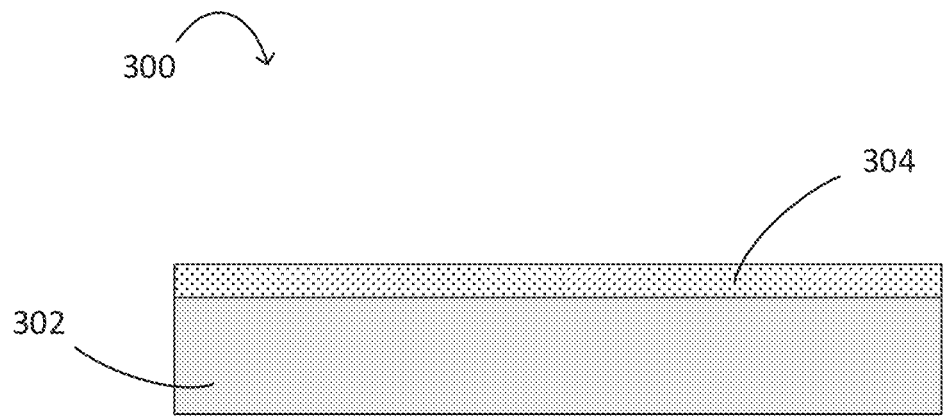
FIGS. 3-14 are cross-sectional side views of various stages in the manufacture of a package substrate utilizing a dielectric bi-layer, in accordance with various embodiments.

FIG. 3 illustrates a conductive seed layer 304 deposited on dielectric layer 302 to create assembly 300. Seed layer 304 may be made of any suitable conductive material, such as copper, or combination of conductive materials, and may be deposited by any suitable process, such as electroless deposition or by sputtering.

Figure 4:
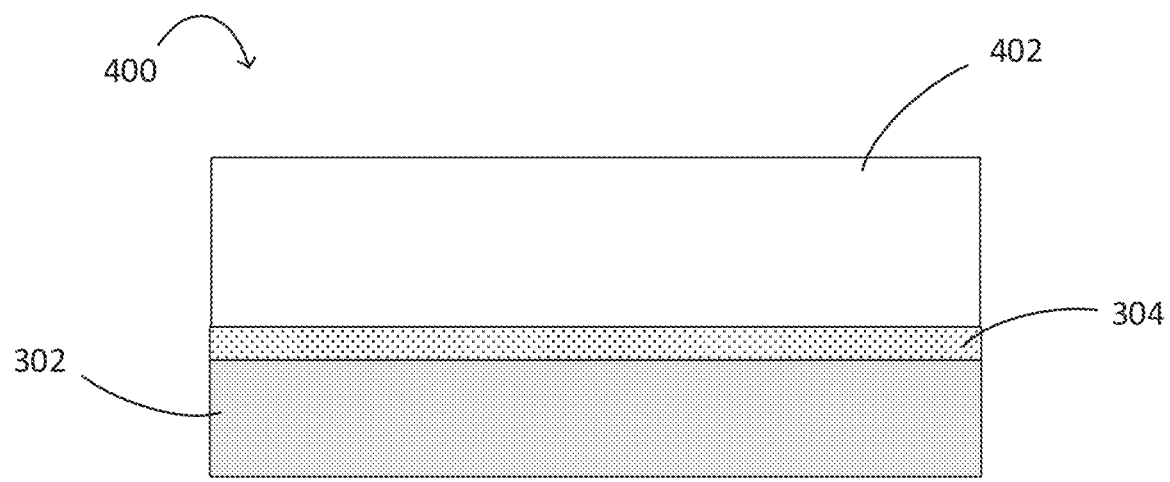

FIG. 4 illustrates assembly 400, which is assembly 300 after depositing photoresist layer 402 over the seed layer 304. Photoresist may be deposited using any suitable process. If conductive interconnects are formed using lithography, photoresist layers may be deposited using any suitable process, such as lamination, and may be positively or negatively charged to create crosslinked and non-crosslinked portions using a radiation source for patterning conductive material layer. Non-crosslinked portions dissolve to form openings where conductive material may be deposited.

Figure 5:
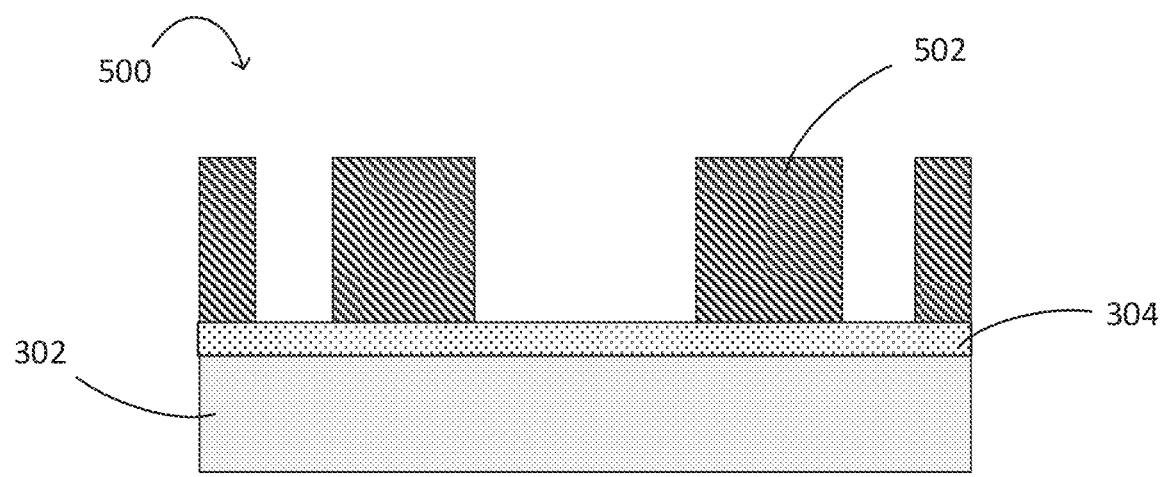

FIG. 5 illustrates assembly 500, which is assembly 400 after patterning of photoresist layer 402. For one embodiment, the patterning of photoresist layer 402 may be implemented with lithographic patterning processes (e.g., exposed with a radiation source through a routing layer mask and developed with a developer) to pattern traces and pads.

Figure 6:
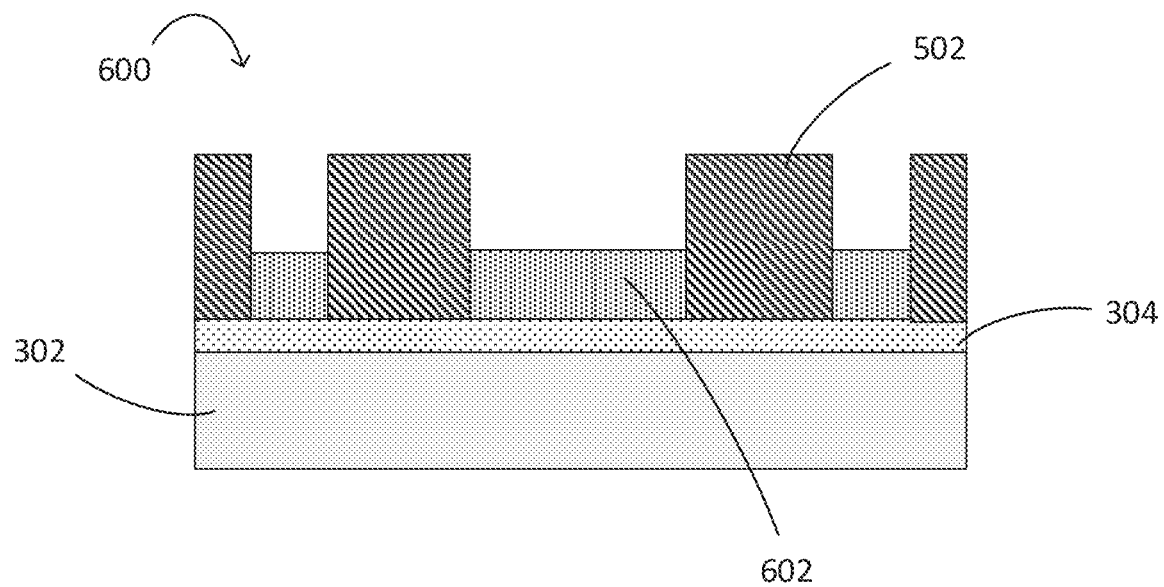

FIG. 6 illustrates assembly 600, which is assembly 500 after conductive material layer 602 is deposited. Conductive material layer 602 may be any type of conductive metal or combination of conductive metals, such as, aluminum (Al), copper (Cu), tungsten (W), cobalt (Co), ruthenium (Ru), nickel (Ni), iron (Fe), and molybdenum (Mo) and/or one or more alloys comprising aluminum (Al), copper (Cu), tungsten (W), cobalt (Co), ruthenium (Ru), manganese (Mn), magnesium (Mg), boron (B), phosphorus (P), nitrogen (N), carbon (C), and sulfur (5). As illustrated, conductive material 602 is deposited into openings formed by the patterned photoresist layer 502 to form conductive traces and pads. In some embodiments, conductive material 602 is formed using an electrolytic copper plating process. In some embodiments, conductive lines and pads may be formed with a copper electroplating process, sputtered copper, or the like.

Figure 7:
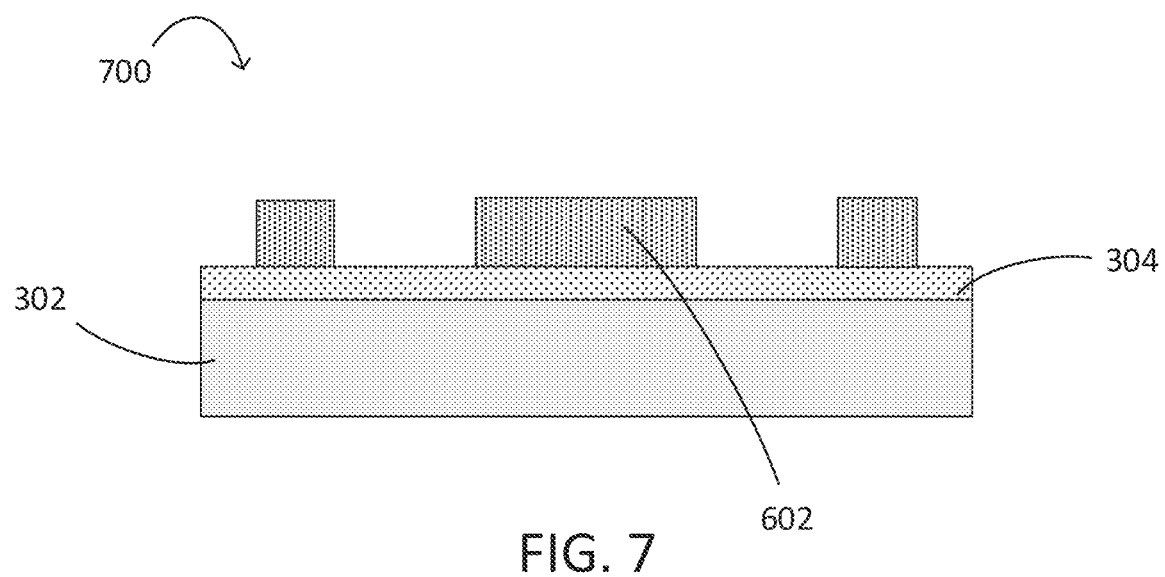

FIG. 7 illustrates assembly 700, which is assembly 600 after photoresist layer 502 is removed. In some embodiments, photoresist layer 502 may be removed later in the process.

Figure 8:
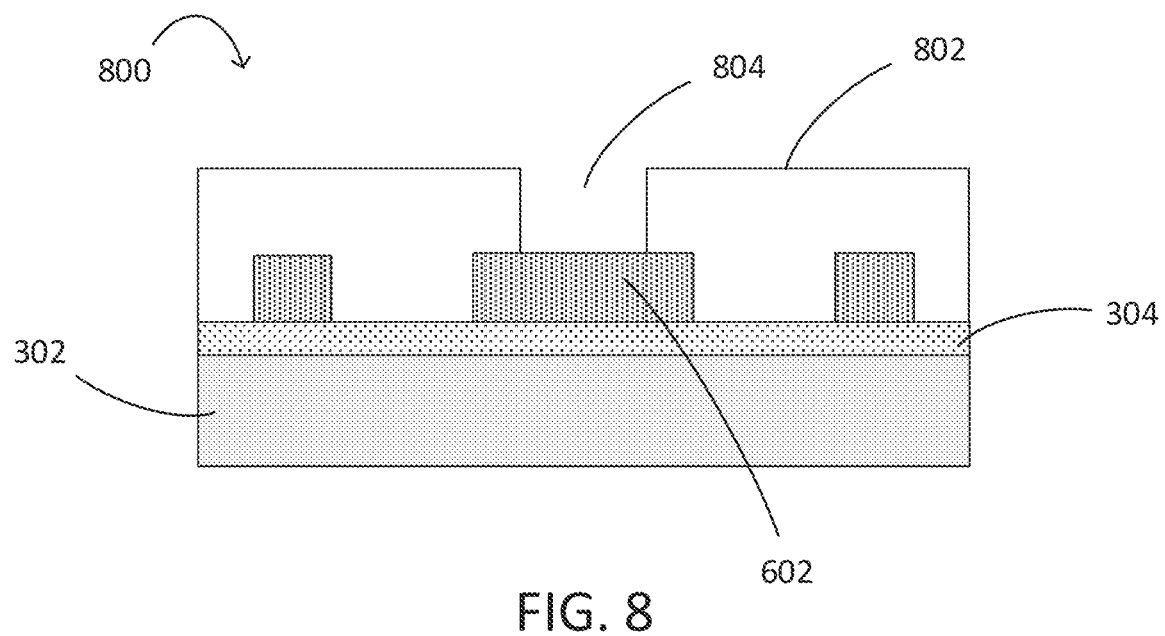

FIG. 8 illustrates assembly 800, which is assembly 700 after second photoresist layer 802 is deposited and patterned to form conductive via opening 804. Second photoresist layer 802 is deposited to protect previously electroplated pads and traces that will be connected by conductive vias. Second photoresist layer 802 made be deposited using any suitable process, for example, a dry film resist lamination or liquid coating through slit or spin coating process. In some embodiments, via opening 804 has substantially vertical or parallel sidewalls. In some embodiments, via opening 802 has angled sidewalls to form tapered vias.

Figure 9:
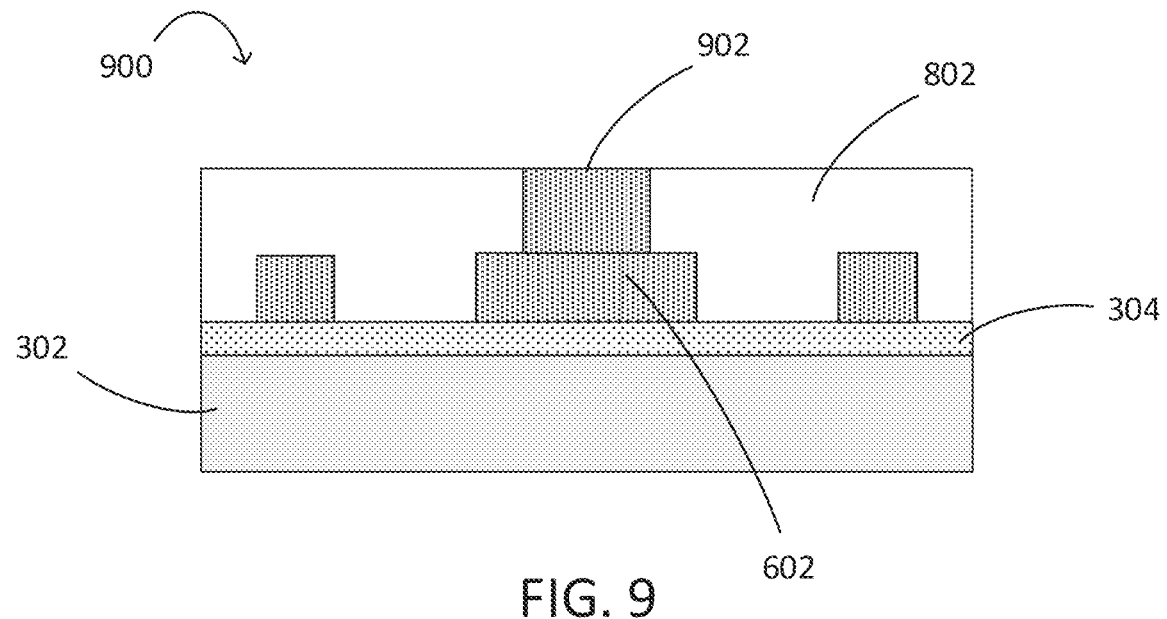

FIG. 9 illustrates assembly 900, which is assembly 800 after conductive material is deposited into via opening 804 to form via 902. Conductive material may be deposited only on the portions of the exposed conductive layer, such as via opening 804. Conductive vias or pillars may be formed from copper and may act as vertical interconnects between adjacent conductive layers. In various embodiments, the via 902 may be filled with same or different materials. For example, the via may include, consist of, or consist essentially of copper (Cu). The via 902 may include, consist of, or consist essentially of one or more bulk materials comprising aluminum (Al), copper (Cu), tungsten (W), cobalt (Co), ruthenium (Ru), nickel (Ni), iron (Fe), and molybdenum (Mo)

and/or one or more alloys comprising aluminum (Al), copper (Cu), tungsten (W), cobalt (Co), ruthenium (Ru), manganese (Mn), magnesium (Mg), boron (B), phosphorus (P), nitrogen (N), carbon (C), and sulfur (5). In some embodiments, the via thickness may be 2-10 um. In some embodiments, the via thickness may be 2-3 um.

Figure 10:
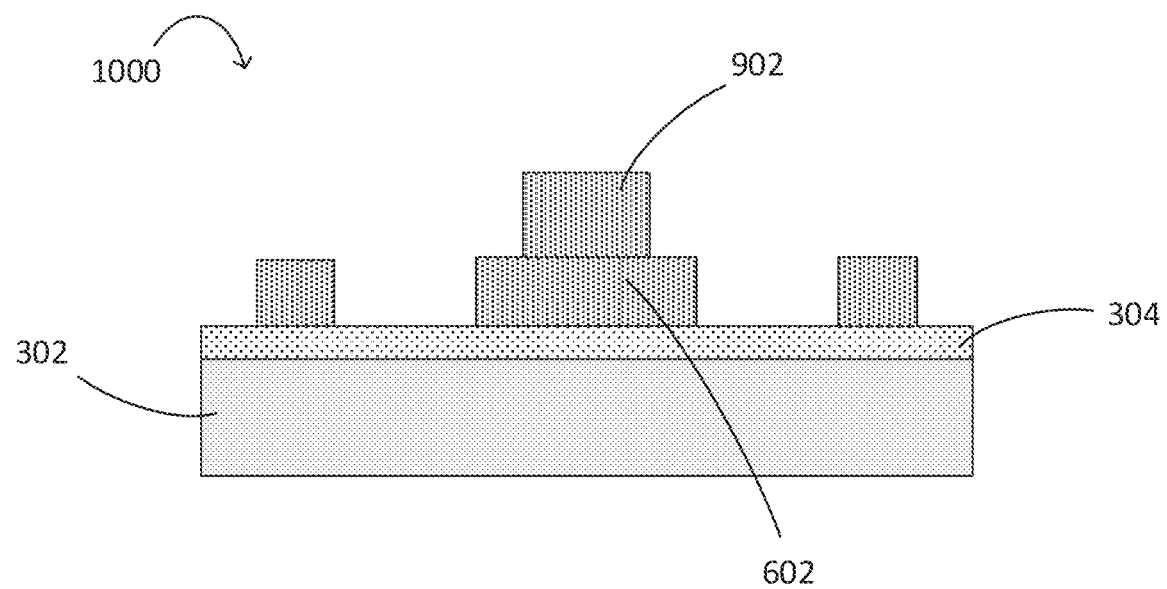

FIG. 10 illustrates assembly 1000, which is assembly 900 after second photoresist layer 802 is removed. In some embodiments, if photoresist layer 502 was not removed previously, photoresist layer 502 is removed.

Figure 11:
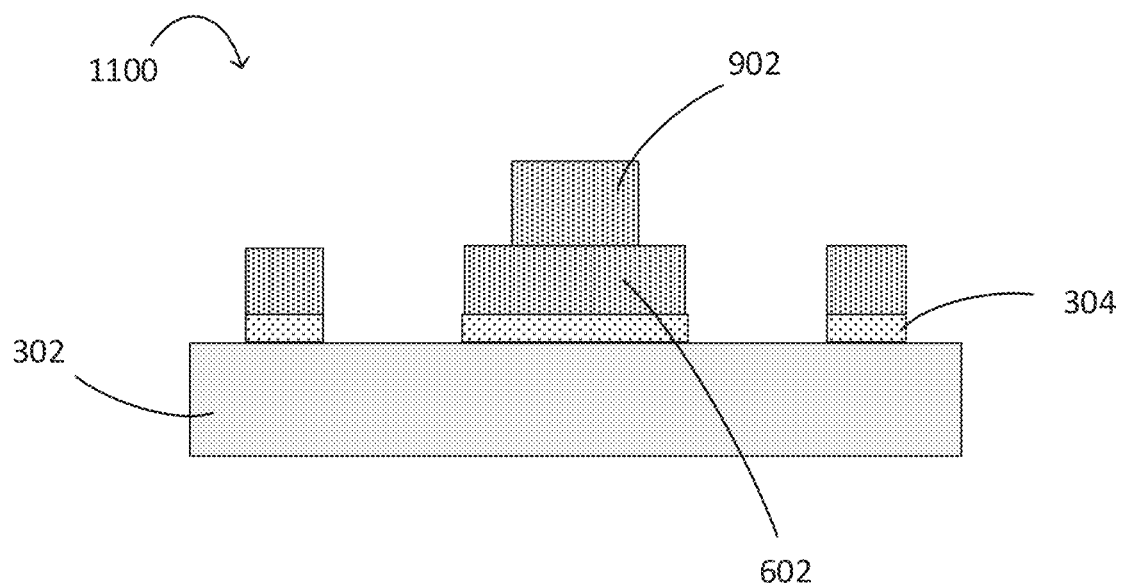

FIG. 11 illustrates assembly 1100, which is assembly 1000 after exposed portions (non-metal layer portions) of seed layer 304 are etched. In some embodiments, portions of exposed seed layer 304 may be etched with a flash etching process, a wet etch process, or a dry etch process.

Figure 12:
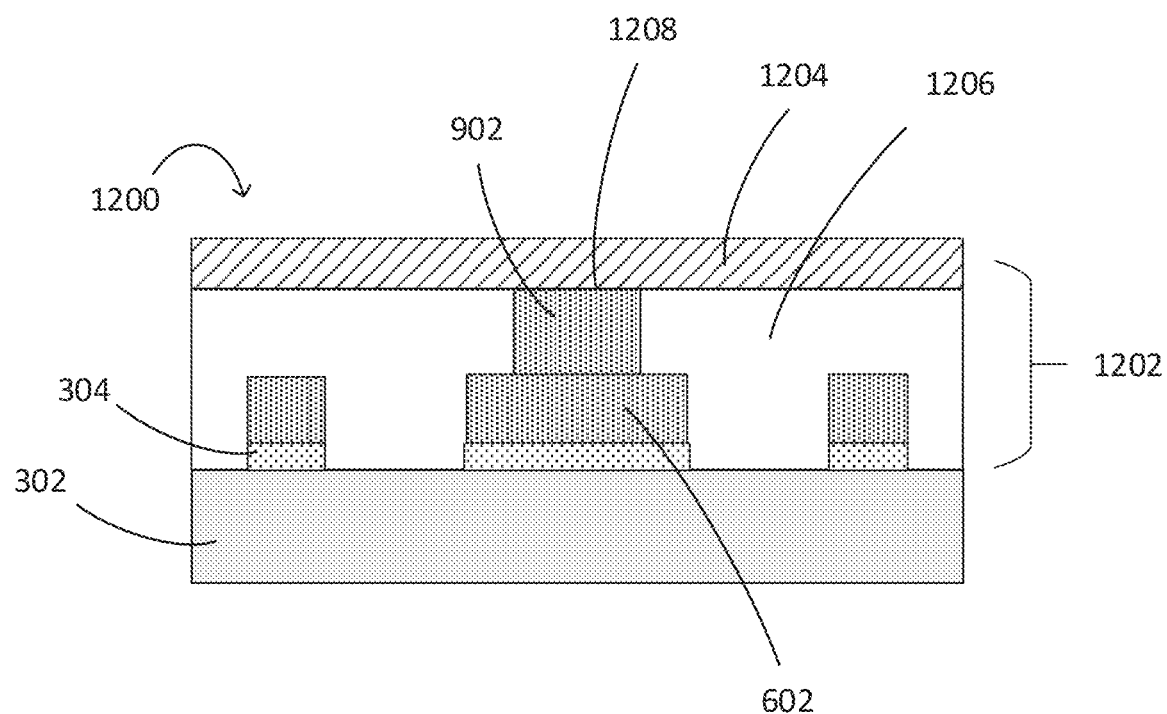

FIG. 12 illustrates assembly 1200, which is assembly 1100 after dielectric bi-layer 1202 is deposited on the conductive features. Dielectric bi-layer 1202 may include a first sub-layer 1204 and a second sub-layer 1206. The first and second sub-layers may be any suitable thickness. For example, in some embodiments, the second sub-layer 1206 may be formed having a top surface that is substantially planar 1208 with the top surface of the raised conductive feature, which as shown is conductive via 902. In some embodiments, the second sub-layer may minimally cover the raised conductive feature. In some embodiments, the second sub-layer may completely cover the raised conductive feature. As shown, the second sub-layer may be adjacent dielectric layer 302 and may cover the conductive layers 304, 602 and planar with the top surface of conductive feature 902. The first sub-layer 1204 may be formed on the second sub-layer 1206. In some embodiments, the thickness of dielectric sub-layers 1204, 1206 may be minimized to reduce the etching time required to expose the one or more vias in a subsequent processing operation, in some embodiments, the first sub-layer thickness is approximately 1-3 um, and the second sub-layer thickness is approximately 4-20 um. Although FIG. 12 shows the second sub-layer as thicker than the first sub-layer, in some embodiments, the first sub-layer is thicker than the second sub-layer. In some embodiments, the first and second sub-layers are approximately the same thickness. For example, the first and second sub-layers both may be approximately 5 um thick, where the total dielectric bi-layer thickness is approximately 10 um. In some embodiments, the first sub-layer thickness is approximately 12-15 um and the second sub-layer thickness is 5-8 um, where the total dielectric bi-layer thickness is approximately 20 um. In some embodiments, the first sub-layer thickness is approximately 5-8 um and the second sub-layer thickness is 8-10 um, where the total dielectric bi-layer thickness is approximately 20 um. In some embodiments, sub-layer thickness may depend on the removal process and may account for planarization margin of error. In some embodiments, the sub-layer thickness may depend on the thickness of the raised feature on the conductive layer.

Dielectric bi-layer 1202 may include a first sub-layer 1204 having a first material property and a second sub-layer 1206 having a second material property. The first and second material properties may have differences that are detectable by a sensor, such as an optical sensor or an electrical sensor, to indicate the presence of the first sub-layer, the presence of the second sub-layer, and the interface between the first and second sub-layers. In some embodiments, a sub-layer material may include one or more fillers to change the optical properties of the layer, for example, a pigment, a dye, a light-scattering particle, and a light-absorptive particle, among others, to indicate the presence of the sub-layer. For example, the optical sensor may detect different absorptance, reflectance, fluorescence, transmittance, and emittance values of the materials. The change in optical property may be, for example, fluorescence, photochromic, color, or opaqueness. In some embodiments, the material may include an organic or inorganic ultraviolet-visible fluorescent pigment or dye where the material reversibly changes color when exposed to ultraviolet light. In some embodiments, the material may include an ultraviolet-infrared fluorescent pigment or dye where the material emits infrared light when exposed to ultraviolet light. In some embodiments, the material may include fluorescent organic molecules, such as coumarins or quantum dots. In some embodiments, a sub-layer material may have inherent optical properties that may be different from the other sub-layer and may be detected by an optical sensor.

In some embodiments, the first and second sub-layers may have different electrical properties, such as, for example, capacitance value, dielectric loss tangent value, and dielectric constant, where an electrical sensor may be used to detect the first sub-layer, the second sub-layer, and the interface between the first and second sub-layers. In some embodiments, a sub-layer material may have different electrical properties, where the dielectric loss tangent value ranges from 0.001-0.03. In some embodiments, a sub-layer material may have different electrical properties, where the dielectric constant ranges from 2-5. In some embodiments, the first and second sub-layers may have different mechanical properties, such as, for example, coefficient of thermal expansion below glass transition temperature, modulus of elasticity, glass transition temperature, elongation, and tensile strength. In some embodiments, a sub-layer material may have different mechanical properties, where the coefficient of thermal expansion below glass transition temperature ranges from 3-50 ppm. In some embodiments, a sub-layer material may have different mechanical properties, where the modulus of elasticity ranges from 3-15 GPa. In some embodiments, a sub-layer material may have different mechanical properties, where the glass transition temperature ranges from 125-250 degrees Celsius. In some embodiments, a sub-layer material may have different mechanical properties, where the elongation ranges from 0.5-7.5%. In some embodiments, a sub-layer material may have different mechanical properties, where the tensile strength ranges from 75-150 MPa. The different mechanical properties of the first and second sub-layers are measurable and may be used to detect the first sub-layer, the second sub-layer, and the interface between the first and second sub-layers.

The detectable difference between the first and second sub-layer material properties enables a faster, gross, and less precise planarization of the first sub-layer to be performed, and, then, when the interface between the sub-layers or the second sub-layer is detected, the top surface of the conductive via may be exposed, or a finer and/or more precise planarization to expose the top surface of the conductive via may be performed. In some embodiments, the sensor may be incorporated into the dielectric removal tool to monitor, continuously or intermittently, for an optical, electrical, or mechanical property. In some embodiments, the sensor may be a separate tool that may be incorporated into the manufacturing process to monitor, continuously or intermittently, for an optical, electrical, or mechanical property.

Dielectric bi-layer 1202 may be formed using any suitable process, such as lamination or slit coating and curing. In some embodiments, the dielectric bi-layer may be a preformed laminate. In some embodiments, the dielectric bi-layer may be a slurry or varnish that separates into two layers when cured. The curing time and temperature may vary and may be tailored based on the materials used to make the dielectric bi-layer slurry. Further, the slurry may be formulated so that the first and second sub-layers have the specified final material compositions. The dielectric bi-layer may be made with any suitable material having the desired properties. The dielectric bi-layer may be made of any of the materials as described above with respect to FIG. 2.

The dielectric bi-layer may be formulated to optimize performance. In some embodiments, the first and second sub-layer may be formed from materials having different planarization rates. For example, the first sub-layer having primarily resin material may planarize more quickly and more easily as compared to the second sub-layer having primarily filler material. For example, the first sub-layer may have a material hardness that is lower than the material hardness of the second sub-layer.

Figure 13:
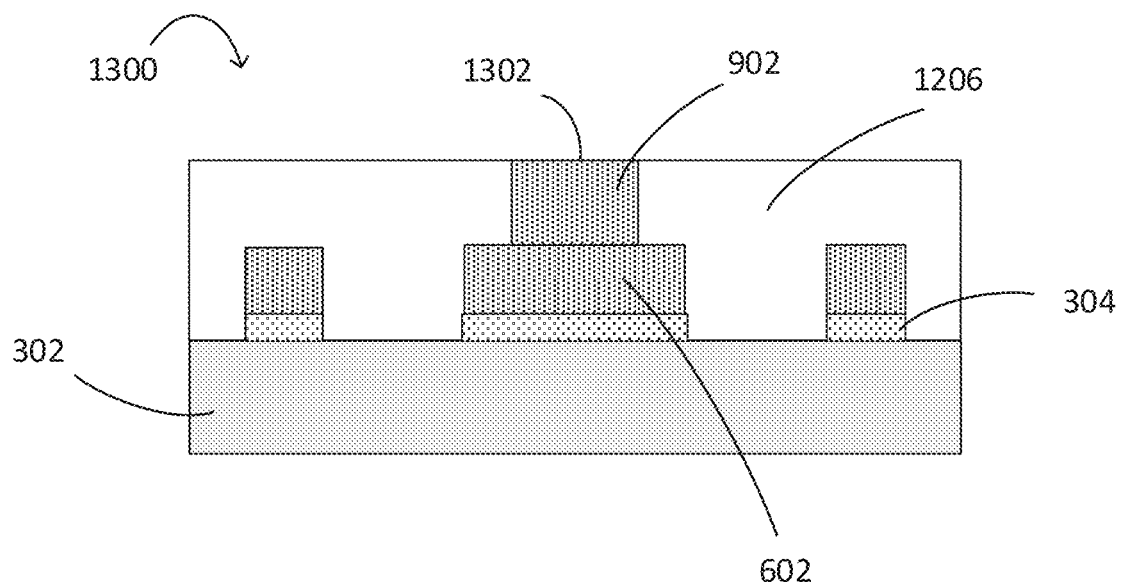

FIG. 13 illustrates assembly 1300, which is assembly 1200 after the first sub-layer is removed to reveal the top surface of the conductive via 1304. The first sub-layer may be removed by any suitable process, including mechanical etching, chemical etching, such as desmear, or combination chemical mechanical planarization (CMP) processes, or non-planarization processes such as plasma etchback. Depending on the precision of the application process, the top of the second sub-layer may be planar with the top of the raised feature, may be below the top of the raised feature, or may be above the top of the raise feature. In some embodiments, where the top of the second sub-layer is above the top of the raised feature, a portion of the second sub-layer may be planarized to reveal the top surface of the conductive via 1304. A finer planarization process may be performed when removing the second sub-layer so that a minimal amount of conductive material is removed from the conductive via. Whereas, when removing the first sub-layer using a less precise process, a greater amount of conductive material may be removed from the raised feature. Examples of a finer planarization process may include a decrease in pressure, a decrease in speed, a change in the platen, and a change in the slurry to reduce removal rate or increase material selectivity. The detectable difference between the first and second sub-layer material properties enables a faster, gross, and less precise planarization of the first sub-layer to be performed, and, then, when the interface between the sub-layers is detected, a finer and/or more precise planarization may be performed to reveal the top surface of the conductive via. In some embodiments, only the first sub-layer is removed to reveal the top surface of the via. In some embodiments, the first sub-layer as well as some of the second sub-layer are removed to reveal the top surface of the via.

Figure 14:
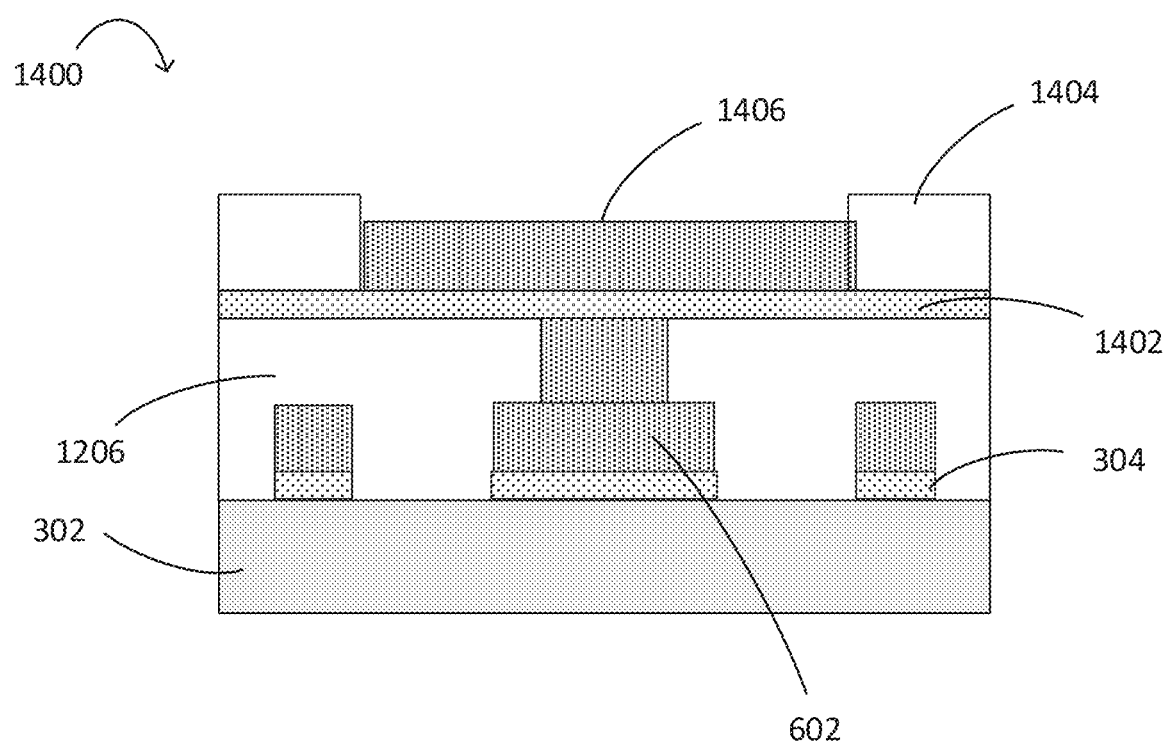

FIG. 14 illustrates assembly 1400, which is assembly 1300 after the process described in FIGS. 3-6 is repeated to add another sputter seed layer 1402, patterned photoresist layer 1404, and conductive pad 1406. Additional dielectric bi-layers, sputter seed layers, and conductive material layers, including conductive vias, may be added as described in FIGS. 3-13. Photoresist layers may be formed with any suitable process, such as lamination, slit coating, or spin coating, and may be positively or negatively charged to create crosslinked and non-crosslinked portions using ultraviolet for patterning conductive material layer. Non-crosslinked portions dissolve to form openings where conductive material may be deposited. Conductive features further may be formed using dual mask exposure process or a multi-layer photoresist lithography process.

Figure 15:
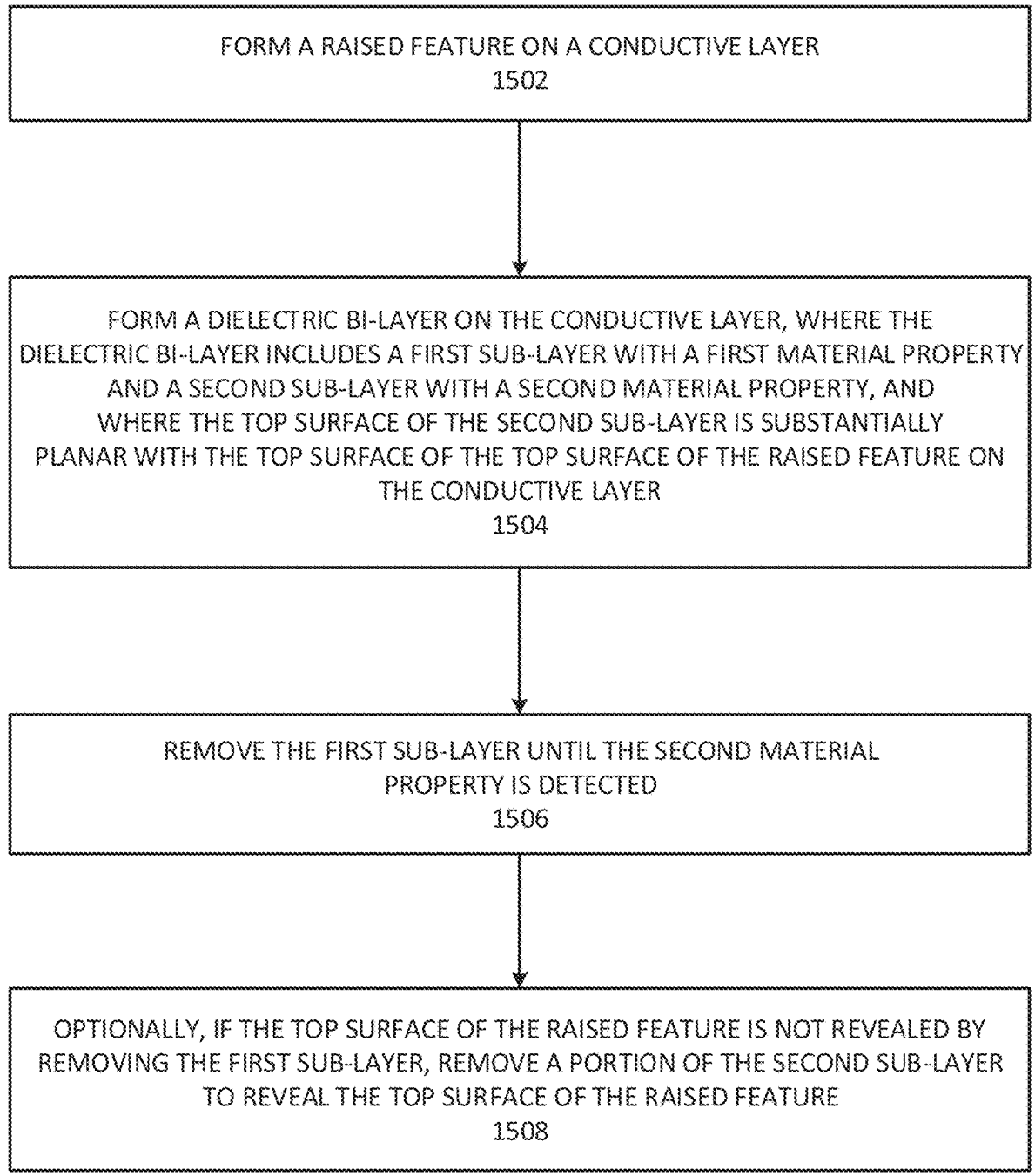
FIG. 15 is a process flow diagram of an example method of forming a package substrate utilizing a dielectric bi-layer, in accordance with various embodiments.

FIG. 15 is a process flow diagram of an example method of forming a package substrate utilizing a dielectric bi-layer, in accordance with various embodiments.

At 1502, a raised feature on a conductive layer may be formed. At 1504, a dielectric bi-layer may be formed on the conductive layer. The dielectric bi-layer may include a first sub-layer having a first material property and a second sub-layer having a second material property. The first and second material properties may be detectable using a sensor. The dielectric bi-layer may cover the raised feature on the conductive layer. The second sub-layer may be adjacent the conductive layer. The top surface of the second sub-layer may be substantially planar with the top surface of the raised conductive feature. At 1506, the first sub-layer may be removed, for example, by planarization, until the second sub-layer material property is detected. At 1508, if the top surface of the raised feature is not revealed by removing the first sub-layer until the second sub-layer is detected, a portion of the second sub-layer may be removed to reveal the top surface of the raised feature.

FIGS. 16-19 are cross-sectional side views of the manufacture of a portion of an example package substrate build up layer utilizing a dielectric bi-layer, in accordance with various embodiments.

Figure 16:
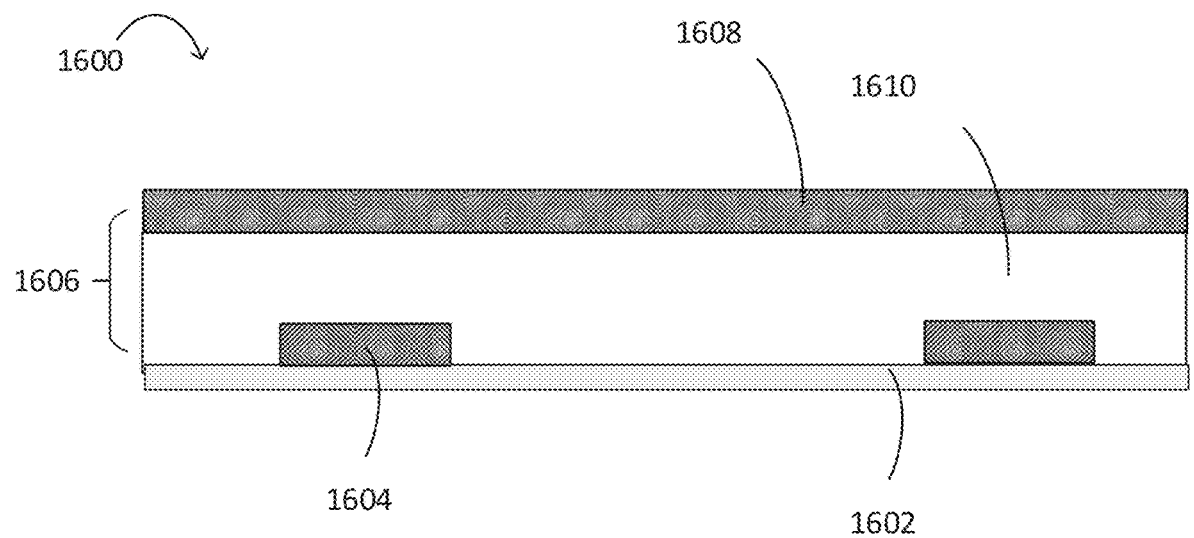
FIGS. 16-19 are cross-sectional side views of the manufacture of a package substrate build up layer utilizing a dielectric bi-layer, in accordance with various embodiments.

FIG. 16 illustrates features of a patterned conductive layer 1604 and a dielectric bi-layer 1606 on dielectric layer 1602 to create assembly 1600. The dielectric bi-layer 1606 may be made with any suitable material having the desired properties. Dielectric bi-layer 1606 may include a first sub-layer 1608 with a first material property and a second sub-layer 1610 with a second material property. The different material properties may be formulated based on the desired performance of the materials; for example, the second sub-layer may be more susceptible to etching processes, such as chemical etching (including desmear) or plasma, compared to the first sub-layer so that more of the second sub-layer is removed during an etching process. In some embodiments, the dielectric bi-layer may include various epoxies, resins, and filler material, such as, glass or silica, among other organic or inorganic fillers. In some embodiments, the first dielectric sub-layer material may be a resin-rich layer of mainly a polymer-based resin or organic polymeric material by weight. In some embodiments, the second dielectric sub-layer material may be a filler-rich layer of about 20% to 90% organic, inorganic, or synthetic filler by weight. In some embodiments, the second dielectric sub-layer material may be about 40% to 70% filler by weight. For example, the first dielectric sub-layer material may be a resin-rich material, such as epoxy resin, epoxy molding compound (EMC), or polyimide, where the density proportion of non-filler material in the dielectric composite is greater than 50% by weight, and the second sub-layer material may be a filler-rich material, including silica, alumina, barium titanate, or other synthetic organic fillers, where the density proportion of filler in the dielectric composite is greater than 50% by weight. In some embodiments, the dielectric sub-layer materials may be selected so that one sub-layer is removed more readily (i.e., is more susceptible to etching or planarization) as compared to the other sub-layer. For example, in some embodiments, the resin-rich layer may be less susceptible to removal as compared to the filler-rich layer.

Dielectric bi-layer 1606 may be formed using any suitable process, such as lamination or slit coating and curing. In some embodiments, the dielectric bi-layer may be a preformed laminate. In some embodiments, the dielectric bi-layer may be a slurry or varnish, which is a solid filler material suspended inside of a viscous semi-solid that phase separates into two layers (i.e., the First and second sub-layers).

Although FIG. 16 shows the second sub-layer as thicker than the first sub-layer, the thicknesses of the sub-layers may vary. In some embodiments, the first sub-layer thickness is approximately 1-3 um, and the second sub-layer thickness is approximately 4-20 um. In some embodiments, the first and second sub-layers are approximately the same thickness. For example, the first and second sub-layers may be both approximately 5 um thick, where the total dielectric bi-layer thickness is approximately 10 um. In some embodiments, the first sub-layer thickness is approximately 5-8 um and the second sub-layer thickness is 8-12 um. In some embodiments, sub-layer thickness may depend on the removal process and the material's susceptibility to removal. In some embodiments, the sub-layer thickness may depend on the desired thickness of the conductive via.

Dielectric layer 1602 may be a previously formed dielectric build up layer or may be a substrate. Substrate may be made of any suitable material, such as stainless steel, glass, silicon, fiber-glass reinforced epoxy, among others. In some embodiments, substrate may be temporary and may include a release layer. In some embodiments, substrate may be a core that is permanently with the package substrate. For example, substrate may be a copper clad laminate core where a dielectric layer is hard pressed on the copper and thermally cured.

Figure 17:
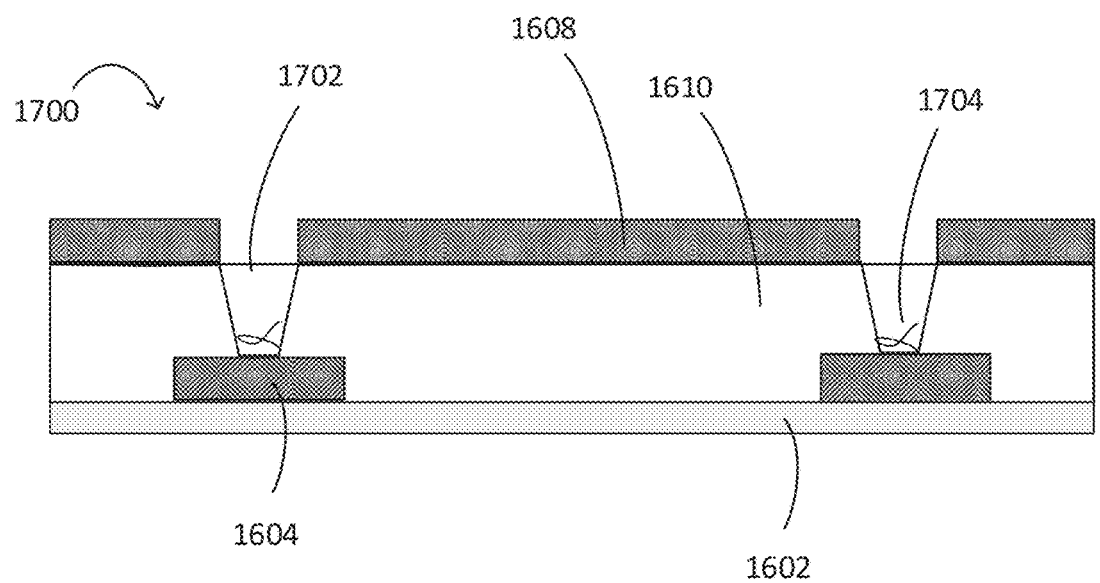

FIG. 17 illustrates assembly 1700, which is assembly 1600 after drilling via openings 1702 in dielectric bi-layer 1606. Via openings 1702 may be created, for example, by laser drilling, which may leave behind dielectric residue 1704. After laser drilling, via openings 1702 may have angled sidewalls that form conical-shaped vias.

Figure 18:
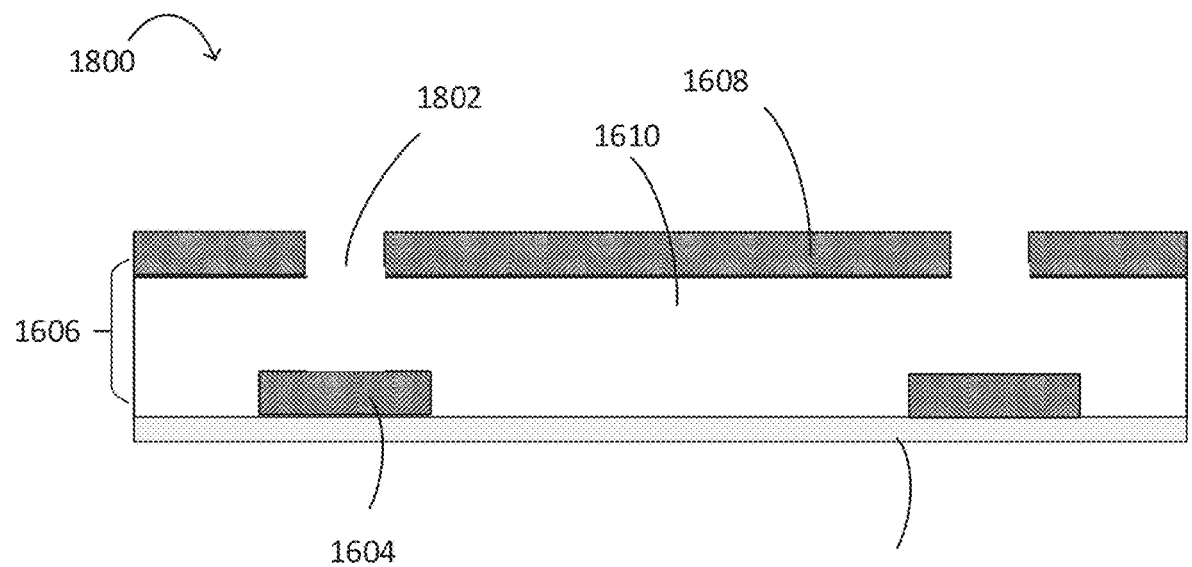

FIG. 18 illustrates assembly 1800, which is assembly 1700 after cleaning away residue 1704 (shown in FIG. 17) in via openings 1802. Via openings may be cleaned using any suitable process, for example, a wet desmear process. As depicted in FIG. 18, after etching, via openings 1802 may have substantially vertical sidewalls or substantially parallel sidewalls as a result of the second sub-layer being more prone to removal by etching as compared to the first sub-layer. As shown in FIG. 18, the opening in the first sub-layer stays relatively the same size while the opening in the second sub-layer increases due to etching. The sidewalls may be approximately 90-100 degrees to the horizontal plane (i.e., to the underlying conductive layer).

Figure 19:
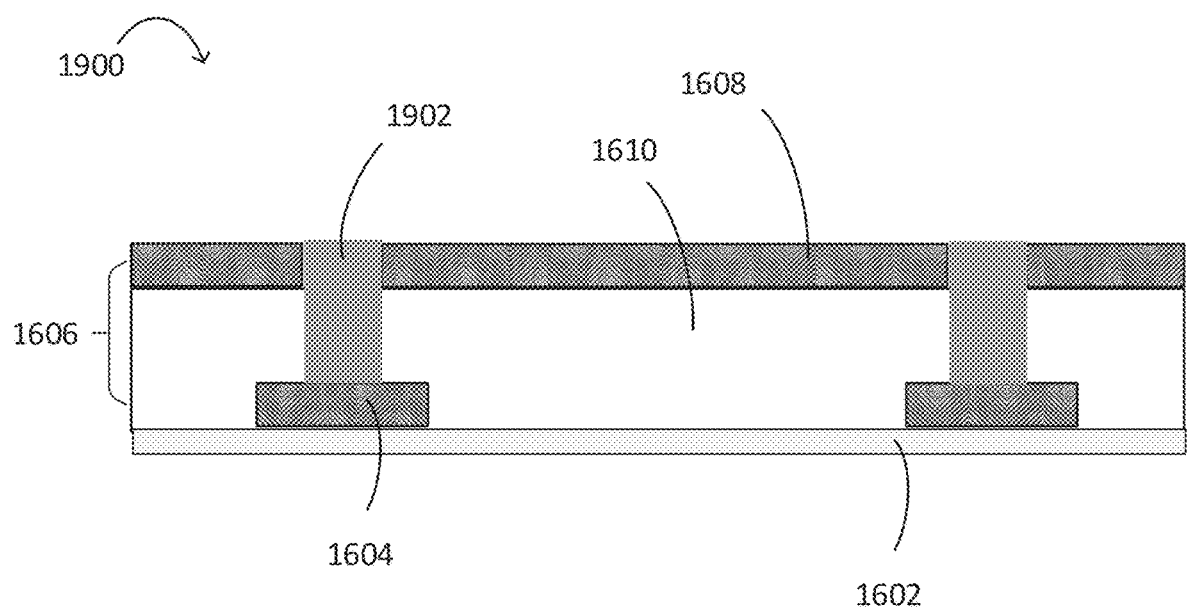

FIG. 19 illustrates assembly 1900, which is assembly 1800 after depositing a conductive material in via openings 1902. Conductive vias 1902 may be formed from any suitable conductive material, for example, copper, aluminum (Al), gold (Au), silver (Ag) and/or alloys thereof, among others, as well as the materials described above with respect to FIG. 9 via formation. Additional dielectric layers and conductive material layers, including vias, may be added by repeating the process as described in FIGS. 16-19.

Figure 20:
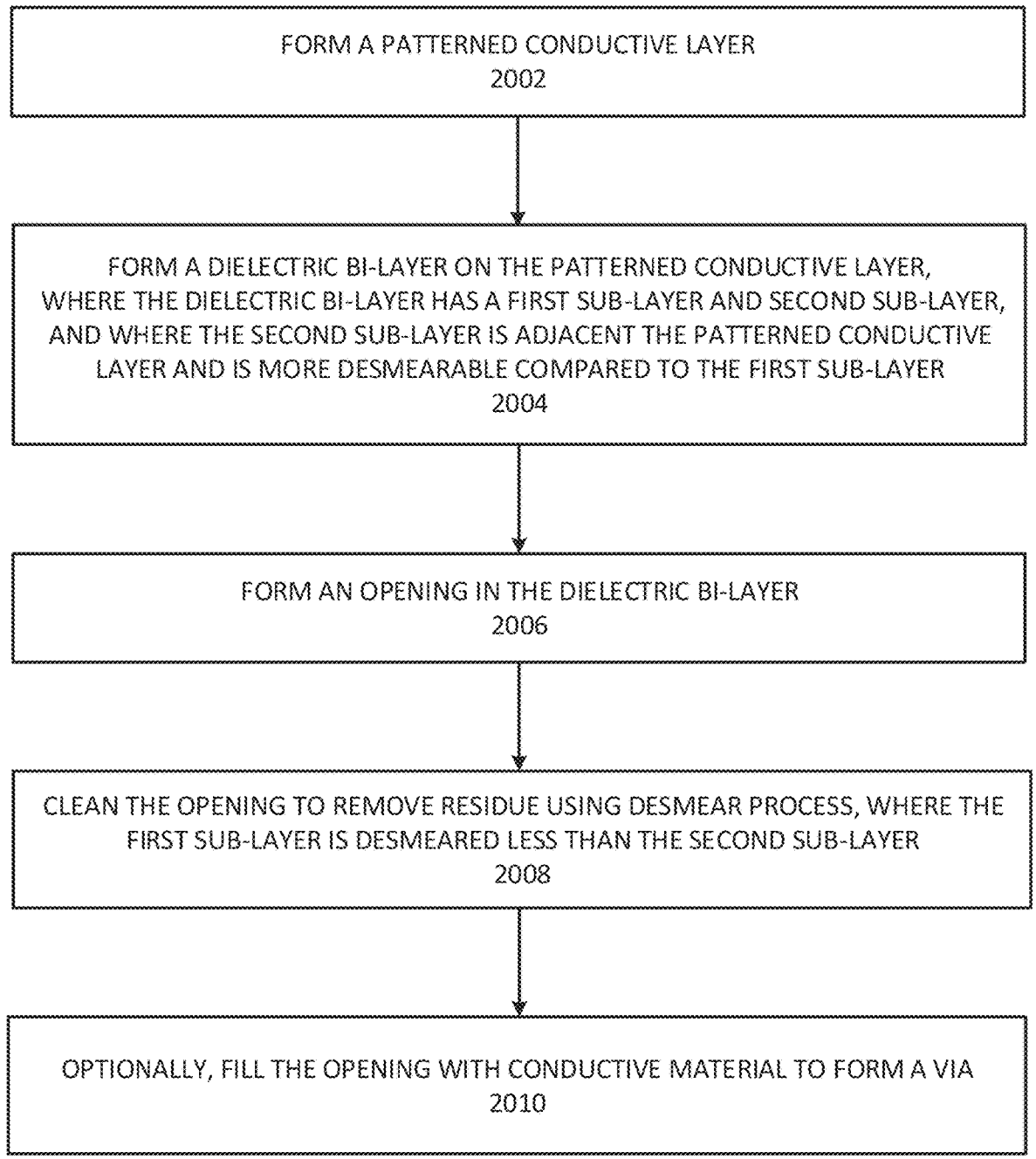
FIG. 20 is a process flow diagram of an example method of forming a package substrate buildup layer utilizing a dielectric bi-layer, in accordance with various embodiments.

FIG. 20 is a process flow diagram of an example method of forming a package substrate buildup layer utilizing a dielectric bi-layer, in accordance with various embodiments. At 2002, a patterned conductive layer may be formed. At 2004, a first dielectric bi-layer may be formed on the patterned conductive layer. The dielectric bi-layer may include a first sub-layer and a second sub-layer, where the second sub-layer is adjacent the patterned conductive layer and is more prone to etching compared to the first sub-layer. At 2006, an opening may be formed in the dielectric bi-layer, for example, by laser drilling. At 2008, residue in the opening may be cleaned, for example, using an etch step like desmear where the desmear process may remove more of the second sub-layer, which is more prone to etching compared to the first sub-layer. At 2010, the opening may be filled with a conductive material to form a conductive via. Additional dielectric layers and conductive layers may be formed by repeating the process as described in 2002 through 2010.

An example method of forming a package substrate according to an embodiment is to laminate a pre-formed dielectric bi-layer on a copper foil coated pre-preg carrier, such as, copper clad laminate, and then cure the dielectric using dry heat. After curing the dielectric bi-layer, laser drill the dielectric bi-layer material to form vias and to expose the copper on the carrier. Use a wet desmear process to clean away any dielectric residue created by the laser drilling. After the wet desmear process, submerge the carrier with the laser cut dielectric in a sol gel based metal oxide dip coating and then dry using dry heat, ultraviolet light, or other suitable method to remove the solvent. After drying, plate the surface with electroless copper and continue with the semi-additive process (SAP), which is known in the art, to add a patterned conductive layer. Additional dielectric bi-layers and conductive layers may be added by depositing another dielectric bi-layer on the conductive layer rather than on a substrate and repeating the process.

Figure 22:
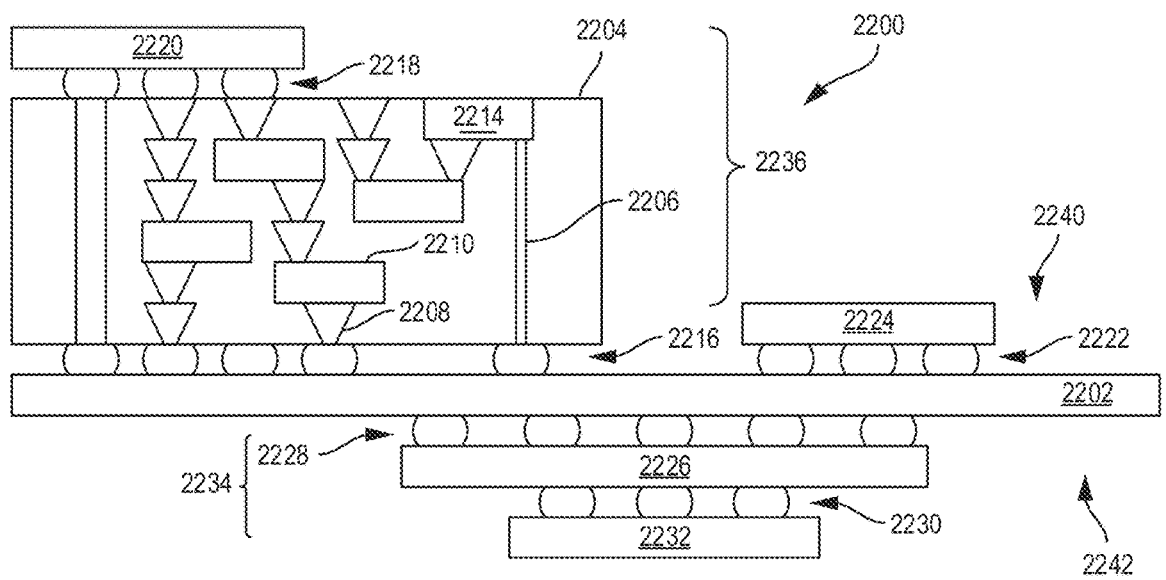
FIG. 22 is a cross-sectional side view of an IC device assembly that may include any of the embodiments of the IC structures disclosed herein.
Figure 23:
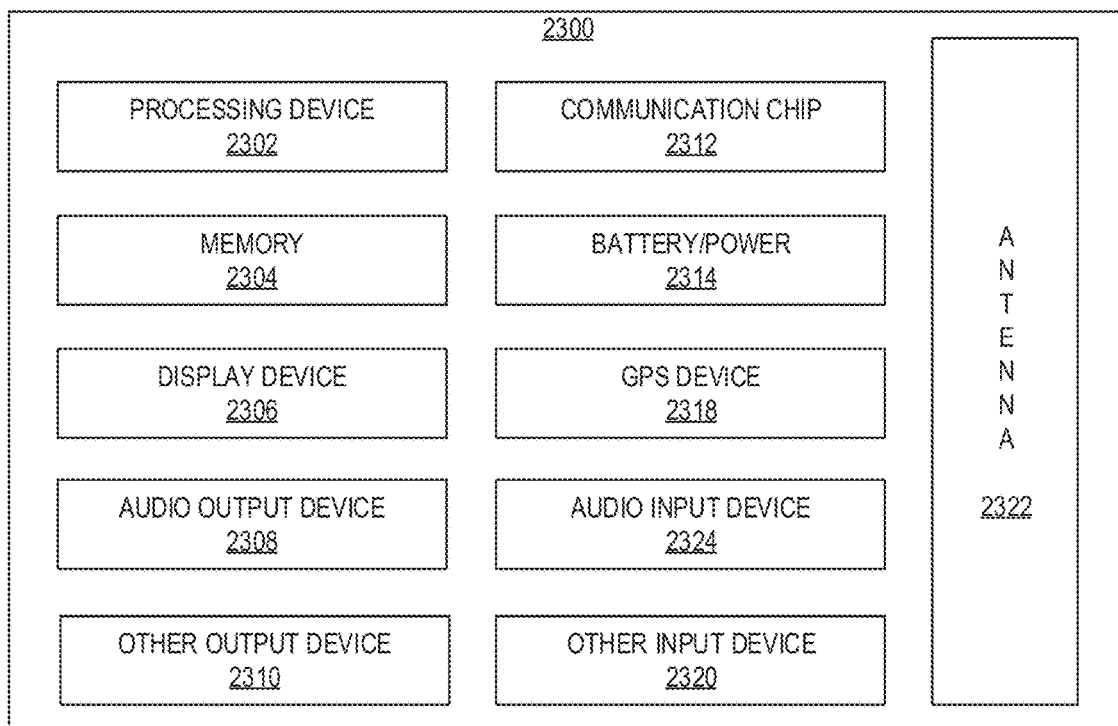
FIG. 23 is a block diagram of an example computing device that may include any of the embodiments of the IC structures disclosed herein.

The package substrates disclosed herein may be included in any suitable electronic device. FIGS. 21-23 illustrate various examples of apparatuses that may be included in, or that may include, one or more of any of the package substrates disclosed herein.

FIGS. 21A-B are top views of a wafer 2101 and dies 2105 that may be included in an IC package along with any of the package substrates disclosed herein. The wafer 2101 may be composed of semiconductor material and may include one or more dies 2105 having IC elements formed on a surface of the wafer 2101. Each of the dies 2105 may be a repeating unit of a semiconductor product that includes any suitable C. After the fabrication of the semiconductor product is complete, the wafer 2101 may undergo a singulation process in which each of the dies 2105 is separated from one another to provide discrete "chips" of the semiconductor product. The die 2105 may include one or more transistors (e.g., some of the transistors 2140 of FIG. 21C, discussed below) and/or supporting circuitry to route electrical signals to the transistors, as well as any other IC components. In some embodiments, the wafer 2101 or the die 2105 may include a memory device (e.g., a static random access memory (SRAM) device), a logic device (e.g., AND, OR, NAND, or NOR gate), or any other suitable circuit element. Multiple ones of these devices may be combined on a single die 2105. For example, a memory array formed by multiple memory devices may be formed on a same die 2105 as a processing device the processing device 2302 of FIG. 23) or other logic that is configured to store information in the memory devices or execute instructions stored in the memory array. In some embodiments, the die 2105 may include circuitry that is to couple to and interact with circuitry provided by integral devices in the package substrate, after the die 2105 is coupled to the package substrate, as discussed above.

FIG. 21C is a cross-sectional side view of an IC device 2100 that may be included in a die that may be coupled to any of the package substrates disclosed herein. In particular, one or more of the IC devices 2100 may be included in one or more dies. The IC device 2100 may be formed on a substrate 2102 (e.g., the wafer 2101 of FIG. 21A) and may be included in a die (e.g., the die 2105 of FIG. 21B). The substrate 2102 may be a semiconductor substrate composed of semiconductor material systems including, for example, N-type or P-type materials systems. The substrate 2102 may include, for example, a crystalline substrate formed using a bulk silicon or a silicon-on-insulator substructure. In some embodiments, the substrate 2102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, or IV may also be used to form the substrate 2102. Although a few examples of materials from which the substrate 2102 may be formed are described here, any material that may serve as a foundation for an IC device 2100 may be used. The substrate 2102 may be part of a singulated die (e.g., the dies 2105 of FIG. 21B) or a wafer (e.g., the wafer 2101 of FIG. 21A). The substrate 2102 may include conductive pathways 2103.

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more source and/or drain (S/D) regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like. The transistors 2140 are not limited to the type and configuration depicted in FIG. 21C and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 2140 may include a gate 2122 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type workfunction metal or N-type work-function metal, depending on whether the transistor 2140 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 2140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102 adjacent to the gate 2122 of each transistor 2140. The S/D regions 2120 may be formed using either an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Electrical signals, such as power and/or input/output (I/O) signals, may be routed to and/or from the transistors 2140 of the device layer 2104 through one or more interconnect layers disposed on the device layer 2104 (illustrated in FIG. 21C as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an interlayer dielectric (ILD) stack 2119 of the IC device 2100.

The interconnect structures 2128 may be arranged within the interconnect layers 2106-2110 to route electrical signals according to a wide variety of designs (in particular, the arrangement is not limited to the particular configuration of interconnect structures 2128 depicted in FIG. 21C). Although a particular number of interconnect layers 2106-2110 is depicted in FIG. 21C, embodiments of the present disclosure include IC devices having more or fewer interconnect layers than depicted.

In some embodiments, the interconnect structures 2128 may include trench structures 2128a (sometimes referred to as "lines") and/or via structures 2128h (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 21C. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 21C. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may provide the contacts to couple to first level interconnects, for example. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

FIG. 22 is a cross-sectional side view of an IC device assembly 2200 that may include any of the embodiments of the package substrates disclosed herein. The K device assembly 2200 includes a number of components disposed on a circuit board 2202. The IC device assembly 2200 may include components disposed on a first face 2240 of the circuit board 2202 and an opposing second face 2242 of the circuit board 2202; generally, components may be disposed on one or both faces 2240 and 2242.

In some embodiments, the circuit board 2202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other embodiments, the circuit board 2202 may be a non-PCB substrate.

The IC device assembly 2200 illustrated in FIG. 22 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 22), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. For example, the coupling components 2218 may be second level interconnects. Although a single IC package 2220 is shown in FIG. 22, multiple IC packages may be coupled to the interposer 2204; indeed, additional interposers may be coupled to the interposer 2204. The interposer 2204 may provide an intervening substrate used to bridge the circuit board 2202 and the IC package 2220. The IC package 2220 may be or include, for example, a die (the die 2105 of FIG. 21B), an IC device (e.g., the IC device 2100 of FIG. 21C), or any other suitable component. In particular, the IC package 2220 may take any of the embodiments of the IC package substrates disclosed herein, and may include a package substrate with high density interconnects. Generally, the interposer 2204 may spread a connection to a wider pitch or reroute a connection to a different connection. For example, the interposer 2204 may couple the IC; package 2220 (e.g., a die) to a ball grid array (BGA) of the coupling components 2216 for coupling to the circuit board 2202. In the embodiment illustrated in FIG. 22, the IC package 2220 and the circuit board 2202 are attached to opposing sides of the interposer 2204; in other embodiments, the IC package 2220 and the circuit board 2202 may be attached to a same side of the interposer 2204. In some embodiments, three or more components may be interconnected by way of the interposer 2204.

The interposer 2204 may be formed of an epoxy resin, a fiberglass-reinforced epoxy resin, a ceramic material, or a polymer material such as polyimide. In some embodiments, the interposer 2204 may be formed of alternate rigid or flexible materials that may include the same materials used in a semiconductor substrate, such as silicon, germanium, and other group III-V and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESC) devices, and memory devices. More complex devices such as radio-frequency (RF) devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art.

The IC device assembly 2200 may include an IC package 2224 coupled to the first face 2240 of the circuit board 2202 by coupling components 2222. The coupling components 2222 may take the form of any of the embodiments discussed above with reference to the coupling components 2216, and the IC package 2224 may take the form of any of the embodiments discussed above with reference to the IC package 2220. In particular, the IC package 2224 may take the form of any of the embodiments of the IC; package disclosed herein, and may include a package substrate with high density interconnects.

The IC device assembly 2200 illustrated in FIG. 22 includes a package-on-package structure 2234 coupled to the second face 2242 of the circuit board 2202 by coupling components 2228. The package-on-package structure 2234 may include an IC package 2226 and an IC package 2232 coupled together by coupling components 2230 such that the IC package 2226 is disposed between the circuit board 2202 and the IC package 2232. The coupling components 2228 and 2230 may take the form of any of the embodiments of the coupling components 2216 discussed above, and the IC: packages 2226 and 2232 may take the form of any of the embodiments of the IC package 2220 discussed above. In particular, the IC packages 2226 and 2232 may take any of the embodiments of the IC package substrate with high density interconnects disclosed herein, FIG. 23 is a block diagram of an example computing device 2300 that may include one or more of the package substrates disclosed herein. For example, any suitable ones of the components of the computing device 2300 may include, or be included in, an IC package having a package substrate with high density interconnects, in accordance with any of the embodiments disclosed herein. A number of components are illustrated in FIG. 23 as included in the computing device 2300, but any one or more of these components may be omitted or duplicated, as suitable for the application. In some embodiments, some or all of the components included in the computing device 2300 may be attached to one or more motherboards. In some embodiments, some or all of these components are fabricated onto a single system-on-a-chip (SoC) die.

Additionally, in various embodiments, the computing device 2300 may not include one or more of the components illustrated in FIG. 23, but the computing device 2300 may include interface circuitry for coupling to the one or more components. For example, the computing device 2300 may not include a display device 2306, but may include display device interface circuitry (e.g., a connector and driver circuitry) to which a display device 2306 may be coupled. In another set of examples, the computing device 2300 may not include an audio input device 2324 or an audio output device 2308, but may include audio input or output device interface circuitry (e.g., connectors and supporting circuitry) to which an audio input device 2324 or audio output device 2308 may be coupled.

The computing device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2300 may include a memory 2304, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2304 may include memory that shares a die with the processing device 2302. This memory may be used as cache memory and may include embedded dynamic random access memory (eDRAM) or spin transfer torque magnetic random-access memory (STT-MRAM).

In some embodiments, the computing device 2300 may include a communication chip 2312 (e.g., one or more communication chips). For example, the communication chip 2312 may be configured for managing wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2312 may operate in accordance with other wireless protocols in other embodiments. The computing device 2300 may include an antenna 2322 to facilitate wireless communications and/or to receive other wireless communications (such as AM or FM radio transmissions).

In some embodiments, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as GPS, EDGE, GPRS, CDMA, WiMAX, LTE, EV-DO, or others. In some embodiments, a first communication chip 2312 may be dedicated to wireless communications, and a second communication chip 2312 may be dedicated to wired communications.

The computing device 2300 may include battery/power circuitry 2314, The battery/power circuitry 2314 may include one or more energy storage devices (e.g., batteries or capacitors) and/or circuitry for coupling components of the computing device 2300 to an energy source separate from the computing device 2300 (e.g., AC line power).

The computing device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display, for example.

The computing device 2300 may include an audio output device 2308 (or corresponding interface circuitry, as discussed above). The audio output device 2308 may include any device that generates an audible indicator, such as speakers, headsets, or earbuds, for example.

The computing device 2300 may include an audio input device 2324 (or corresponding interface circuitry, as discussed above). The audio input device 2324 may include any device that generates a signal representative of a sound, such as microphones, microphone arrays, or digital instruments (e.g., instruments having a musical instrument digital interface (MIDI) output).

The computing device 2300 may include a global positioning system (GPS) device 2318 (or corresponding interface circuitry, as discussed above). The GPS device 2318 may be in communication with a satellite-based system and may receive a location of the computing device 2300, as known in the art.

The computing device 2300 may include an other output device 2310 (or corresponding interface circuitry, as discussed above), Examples of the other output device 2310 may include an audio codec, a video codec, a printer, a wired or wireless transmitter for providing information to other devices, or an additional storage device.

The computing device 2300 may include an other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2300 may have any desired form factor, such as a hand-held or mobile computing device (e.g., a cell phone, a smart phone, a mobile Internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2300 may be any other electronic device that processes data.

The following examples pertain to further embodiments. The various features of the different embodiments may be variously combined with some features included and others excluded to suit a variety of different applications.

Example 1 is an integrated circuit package substrate, including: a patterned conductive layer; a dielectric bi-layer on the patterned conductive layer, wherein the dielectric bi-layer includes a first dielectric sub-layer and a second dielectric sub-layer; and a conductive via in the dielectric bi-layer, wherein the conductive via extends through the first and second dielectric sub-layers, and wherein the via sidewalls are substantially vertical.

Example 2 may include the subject matter of Example 1 and may further specify that the second dielectric sub-layer material is more susceptible to etching compared to the first dielectric sub-layer material.

Example 3 may include the subject matter of Example 1 and may further specify that the via sidewalls are positioned approximately 90-100 degrees to the patterned conductive layer.

Example 4 may include the subject matter of Example 1 and may further specify that the via sidewalls are substantially parallel to each other.

Example 5 may include the subject matter of Example 1 and may further specify that the first dielectric sub-layer material comprises an organic polymer as the majority component by weight.

Example 6 may include the subject matter of Example 1 and may further specify that the organic polymer is selected from the group comprising epoxy resin, epoxy molding compound, and polyimide.

Example 7 may include the subject matter of Example 1 and may further specify that the second dielectric sub-layer material comprises between 20%-90% filler by weight.

Example 8 may include the subject matter of Example 7 and may further specify that the filler comprises one or more of silica, barium titanate, and alumina.

Example 9 may include the subject matter of Example 1 and may further specify that the first dielectric sub-layer thickness is approximately 1-5 um.

Example 10 may include the subject matter of Example 1 and may further specify that the second dielectric sub-layer thickness is approximately 4-20 um.

Example 11 is an integrated circuit package substrate, including: a conductive layer; and a dielectric layer on the conductive layer, wherein the dielectric layer material comprises a fluorescent organic molecule, a quantum dot, a pigment, or a dye.

Example 12 may include the subject matter of Example 11 and may further specify that the dielectric material layer comprises an organic polymer as the majority component by weight.

Example 13 may include the subject matter of Example 12 and may further specify that the organic polymer is selected from the group comprising epoxy resin, epoxy molding compound, and polyimide.

Example 14 may include the subject matter of Example 11 and may further specify that the dielectric layer thickness is approximately 4-20 um.

Example 15 is an integrated circuit package, including: a package substrate including: a patterned conductive layer; a dielectric bi-layer on the patterned conductive layer, wherein the dielectric bi-layer includes a first dielectric sub-layer and a second dielectric sub-layer; and a conductive via in the dielectric bi-layer, wherein the conductive via extends through the first and second dielectric sub-layers, and wherein the via sidewalls are substantially vertical; and a die coupled to the package substrate.

Example 16 may include the subject matter of Example 15 and may further specify that the second dielectric sub-layer material is more susceptible to etching compared to the first dielectric sub-layer material.

Example 17 may include the subject matter of Example 15 and may further specify that the via sidewalls are positioned approximately 90-100 degrees to the patterned conductive layer.

Example 18 may include the subject matter of Example 15 and may further specify that the via sidewalls are substantially parallel to each other.

Example 19 may include the subject matter of Example 15 and may further specify that the first dielectric sub-layer material comprises an organic polymer as the majority component by weight.

Example 20 may include the subject matter of Example 19 and may further specify that the organic polymer is selected from the group comprising epoxy resin, epoxy molding compound, and polyimide.

Example 21 may include the subject matter of Example 15 and may further specify that the second dielectric sub-layer material comprises between 20%-90% filler by weight.

Example 22 may include the subject matter of Example 21 and may further specify that the filler comprises one or more of silica, barium titanate, and alumina.

Example 23 may include the subject matter of Example 15 and may further specify that the first dielectric sub-layer thickness is approximately 1-5 um.

Example 24 may include the subject matter of Example 15 and may further specify that the second dielectric sub-layer thickness is approximately 4-20 um.

Example 25 is an integrated circuit package, including: a package substrate including: a conductive layer; and a dielectric layer on the conductive layer, wherein the dielectric layer material comprises a fluorescent organic molecule, a quantum dot, a pigment, or a dye; and a die coupled to the package substrate.

Example 26 may include the subject matter of Example 25 and may further specify that the dielectric material layer comprises an organic polymer as the majority component by weight.

Example 27 may include the subject matter of Example 26 and may further specify that the organic polymer is selected from the group comprising epoxy resin, epoxy molding compound, and polyimide.

Example 28 may include the subject matter of Example 25 and may further specify that the dielectric layer thickness is approximately 4-20 um.

Example 29 is a method of forming an integrated circuit package substrate, the method including: forming a patterned conductive layer; forming a dielectric bi-layer on the patterned conductive layer, wherein the dielectric bi-layer includes a first dielectric sub-layer and a second dielectric sub-layer, and wherein the second dielectric sub-layer is adjacent the patterned conductive layer and is more susceptible to etching compared to the first dielectric sub-layer; forming an opening in the dielectric bi-layer; and etching the opening, wherein the first dielectric sub-layer is etched less than the second dielectric sub-layer.

Example 30 may include the subject matter of Example 29 and may further include: depositing a conductive material into the opening to form a conductive via, wherein the conductive via sidewalls are substantially vertical.

Example 31 may include the subject matter of Example 29 and may further specify that the first dielectric sub-layer thickness is less than the second dielectric sub-layer thickness.

Example 32 may include the subject matter of Example 29 and may further specify that the dielectric bi-layer is formed by laminating a preformed dielectric bi-layer on the substrate.

Example 33 may include the subject matter of Example 29 and may further specify that the dielectric bi-layer is formed by curing a dielectric material that separates into the first dielectric sub-layer and the second dielectric sub-layer.

Example 34 may include the subject matter of any of Examples 29-33 and may further specify that the first dielectric sub-layer material comprises an organic polymer as the majority component by weight.

Example 35 may include the subject matter of Example 34 and may further specify that the organic polymer is selected from the group comprising epoxy resin, epoxy molding compound, and polyimide.

Example 36 may include the subject matter of any of Examples 29-33 and may further specify that the second dielectric sub-layer material comprises between 20%-90% filler by weight.

Example 37 may include the subject matter of Example 36 and may further specify that the filler comprises one or more of silica, barium titanate, and alumina.

Example 38 may include the subject matter of Example 29, wherein the opening in the dielectric bi-layer is formed by laser drilling.

Example 39 is a method of fabricating an integrated circuit package substrate, the method including: forming a raised feature on a conductive layer; forming a dielectric bi-layer on the conductive layer, wherein the dielectric bi-layer includes a first dielectric sub-layer having a first material property and a second dielectric sub-layer having a second material property, wherein the second dielectric sub-layer is on the conductive layer and the first dielectric sub-layer is on the second dielectric sub-layer, and wherein the top surface of the second dielectric sub-layer is substantially planar with the top surface of the raised feature on the conductive layer; and removing the first dielectric sub-layer until the second material property is detected.

Example 40 may include the subject matter of Example 39 and may further specify that removing the first dielectric sub-layer exposes the top surface of the raised feature on the conductive layer.

Example 41 may include the subject matter of Example 39 and may further include: removing the second dielectric sub-layer to expose the top surface of the raised feature on the conductive layer.

Example 42 may include the subject matter of any of Examples 39-41 and may further specify that the first dielectric sub-layer thickness is less than the second dielectric sub-layer thickness.

Example 43 may include the subject matter of any of Examples 39-42 and may further specify that the dielectric bi-layer is formed by laminating a preformed dielectric bi-layer on the conductive layer.

Example 44 may include the subject matter of any of Examples 39-42 and may further specify that the dielectric bi-layer is formed by curing a dielectric bi-layer material that separates into the first dielectric sub-layer and the second dielectric sub-layer.

Example 45 may include the subject matter of any of Examples 39-44 and may further specify that the first dielectric sub-layer comprises an organic polymer as the majority component by weight.

Example 46 may include the subject matter of Example 45 and may further specify that the organic polymer is selected from the group comprising epoxy resin, epoxy molding compound, and polyimide.

Example 47 may include the subject matter of any of Examples 39-46 and may further specify that the second dielectric sub-layer material comprises between 20%-90% filler by weight.

Example 48 may include the subject matter of Example 47 and may further specify that the filler comprises one or more of silica, barium titanate, and alumina.

Example 49 may include the subject matter of Example 39 and may further specify that the first material property has an electrical property that differs from the electrical property of the second material property.

Example 50 may include the subject matter of Example 49 and may further specify that the electrical property that differs is capacitance, dielectric loss tangent, or dielectric constant.

Example 51 may include the subject matter of Example 39 and may further specify that the first material property has an optical property that differs from the optical property of the second material property.

Example 52 may include the subject matter of Example 51 and may further specify that the optical property that differs is fluorescence, absorptance, reflectance, transmittance, or emittance.

Example 53 may include the subject matter of Example 39 and may further specify that the first material property has a mechanical property that differs from the mechanical property of the second material property.

Example 54 may include the subject matter of Example 53 and may further specify that the mechanical property that differs is coefficient of thermal expansion, modulus of elasticity, glass transition temperature, elongation, or tensile strength.

The invention claimed is:

1. An integrated circuit package substrate, comprising:
a patterned conductive layer;
a dielectric bi-layer in contact with the patterned conductive layer, wherein the dielectric bi-layer includes a first dielectric sub-layer and a second dielectric sub-layer, wherein the second dielectric sub-layer is adjacent the patterned conductive layer and is more susceptible to etching compared to the first dielectric sub-layer, and wherein the first dielectric sub-layer is on the second dielectric sub-layer; and
a conductive via in the dielectric bi-layer, wherein the conductive via extends through the first and second dielectric sub-layers, and wherein a width of the conductive via in the second dielectric sub-layer is greater than a width of the conductive via in the first dielectric sub-layer.

2. The integrated circuit package substrate of claim 1, wherein the second dielectric sub-layer is more susceptible to etching compared to the first dielectric sub-layer.

3. The integrated circuit package substrate of claim 1, wherein the sidewall of the conductive via is positioned approximately 90-100 degrees to the patterned conductive layer.

4. The integrated circuit package substrate of claim 1, wherein the first dielectric sub-layer comprises an organic polymer as a majority component by weight.

5. The integrated circuit package substrate of claim 4, wherein the organic polymer is selected from the group comprising epoxy resin, epoxy molding compound, and polyimide.

6. The integrated circuit package substrate of claim 1, wherein the second dielectric sub-layer comprises between 20% and 90% filler by weight.

7. The integrated circuit package substrate of claim 6, wherein the filler comprises one or more of silica, barium titanate, and alumina.

8. The integrated circuit package substrate of claim 1, wherein a thickness of the first dielectric sub-layer is between 1 um and 5 um.

9. The integrated circuit package substrate of claim 1, wherein a thickness of the second dielectric sub-layer is between 4 um and 20 um.

10. An integrated circuit package substrate, comprising:
a conductive layer including a conductive structure; and
a dielectric bi-layer in contact with the conductive layer, wherein the dielectric bi-layer includes a first dielectric sub-layer and a second dielectric sub-layer, wherein the second dielectric sub-layer is on the conductive layer and is more susceptible to etching compared to the first dielectric sub-layer, wherein the first dielectric sub-layer is on the second dielectric sub-layer, and wherein the conductive structure extends through the first and second dielectric sub-layers and a width of the conductive structure in the second dielectric sub-layer is greater than a width of the conductive via in the first dielectric sub-layer.

11. The integrated circuit package substrate of claim 10, wherein the first dielectric sub-layer comprises an organic polymer as a majority component by weight.

12. The integrated circuit package substrate of claim 11, wherein the organic polymer is selected from the group comprising epoxy resin, epoxy molding compound, and polyimide.

13. The integrated circuit package substrate of claim 10, wherein a thickness of the dielectric bi-layer is between 4 um and 20 um.

14. A method of forming an integrated circuit package substrate, the method comprising:
forming a patterned conductive layer;

forming a dielectric bi-layer on the patterned conductive layer, wherein the dielectric bi-layer includes a first dielectric sub-layer having a first material property and a second dielectric sub-layer having a second material property different from the first material property, wherein the first material property and the second material property are detectable by a sensor, and wherein the second dielectric sub-layer is adjacent the patterned conductive layer and is more susceptible to etching compared to the first dielectric sub-layer;

forming an opening in the dielectric bi-layer; and etching the opening, wherein a width of the opening in the first dielectric sub-layer is less than a width of the opening in the second dielectric sub-layer.

15. The method of claim 14, further comprising:

depositing a conductive material into the opening to form a conductive via, wherein a width of the conductive via in the second dielectric sub-layer is greater than a width of the conductive via in the first dielectric sub-layer.

16. The method of claim 14, wherein the dielectric bi-layer is formed by laminating a preformed dielectric bi-layer on a substrate.

17. The method of claim 14, wherein the dielectric bi-layer is formed by curing a dielectric material that separates into the first dielectric sub-layer and the second dielectric sub-layer.

18. The method of claim 14, wherein a thickness of the first dielectric sub-layer is less than a thickness of the second dielectric sub-layer.

19. The method of claim 14, wherein the opening in the dielectric bi-layer is formed by laser drilling.

\* \* \* \* \*